(12) United States Patent
Chen et al.

(10) Patent No.: US 12,057,341 B2
(45) Date of Patent: *Aug. 6, 2024

(54) SEMICONDUCTOR DEVICE WITH GATE CUT STRUCTURE AND METHOD OF FORMING THE SAME

(71) Applicant: Taiwan Semiconductor Manufacturing Company, Ltd., Hsin-Chu (TW)

(72) Inventors: Chun-Yuan Chen, Hsinchu (TW); Pei-Yu Wang, Hsinchu (TW); Huan-Chieh Su, Changhua County (TW); Yi-Hsun Chiu, Hsinchu County (TW); Cheng-Chi Chuang, New Taipei (TW); Ching-Wei Tsai, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 360 days.

This patent is subject to a terminal disclaimer.

(21) Appl. No.: 17/464,357

(22) Filed: Sep. 1, 2021

(65) Prior Publication Data
US 2022/0238370 A1 Jul. 28, 2022

Related U.S. Application Data

(60) Provisional application No. 63/142,304, filed on Jan. 27, 2021.

(51) Int. Cl.
*H01L 21/762* (2006.01)
*H01L 21/28* (2006.01)
(Continued)

(52) U.S. Cl.
CPC .. *H01L 21/76224* (2013.01); *H01L 21/28017* (2013.01); *H01L 21/823431* (2013.01); *H01L 27/0886* (2013.01); *H01L 29/785* (2013.01)

(58) Field of Classification Search
CPC ....... H01L 21/823431; H01L 21/76224; H01L 2029/7858; H01L 21/823468; H01L 29/785; H01L 21/823821; H01L 29/42392
See application file for complete search history.

(56) References Cited

U.S. PATENT DOCUMENTS 8,772,109 B2   7/2014   Colinge
8,785,285 B2   7/2014   Tsai et al.
(Continued)

*Primary Examiner* — Mary A Wilczewski
*Assistant Examiner* — Nathan A Pridemore
(74) *Attorney, Agent, or Firm* — HAYNES AND BOONE, LLP

(57) ABSTRACT

Semiconductor devices and methods of forming the same are provided. A method according to the present disclosure includes providing a workpiece including a frontside and a backside. The workpiece includes a substrate, a first plurality of channel members over a first portion of the substrate, a second plurality of channel members over a second portion of the substrate, an isolation feature sandwiched between the first and second portions of the substrate. The method also includes forming a joint gate structure to wrap around each of the first and second pluralities of channel members, forming a pilot opening in the isolation feature, extending the pilot opening through the join gate structure to form a gate cut opening that separates the joint gate structure into a first gate structure and a second gate structure, and depositing a dielectric material into the gate cut opening to form a gate cut feature.

20 Claims, 38 Drawing Sheets

(51) Int. Cl.
    *H01L 21/8234*    (2006.01)
    *H01L 27/088*     (2006.01)
    *H01L 29/78*      (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 11,532,744 B2 * | 12/2022 | Chen .................. H01L 29/42372 |
| 11,621,197 B2 * | 4/2023 | Su ..................... H01L 29/66742 |
| | | 257/288 |
| 2019/0341297 A1 * | 11/2019 | Lilak ................. H01L 29/78696 |
| 2022/0131004 A1 * | 4/2022 | Chen ................... H01L 29/0649 |
| 2022/0285512 A1 * | 9/2022 | Cheng ............. H01L 21/823418 |

\* cited by examiner

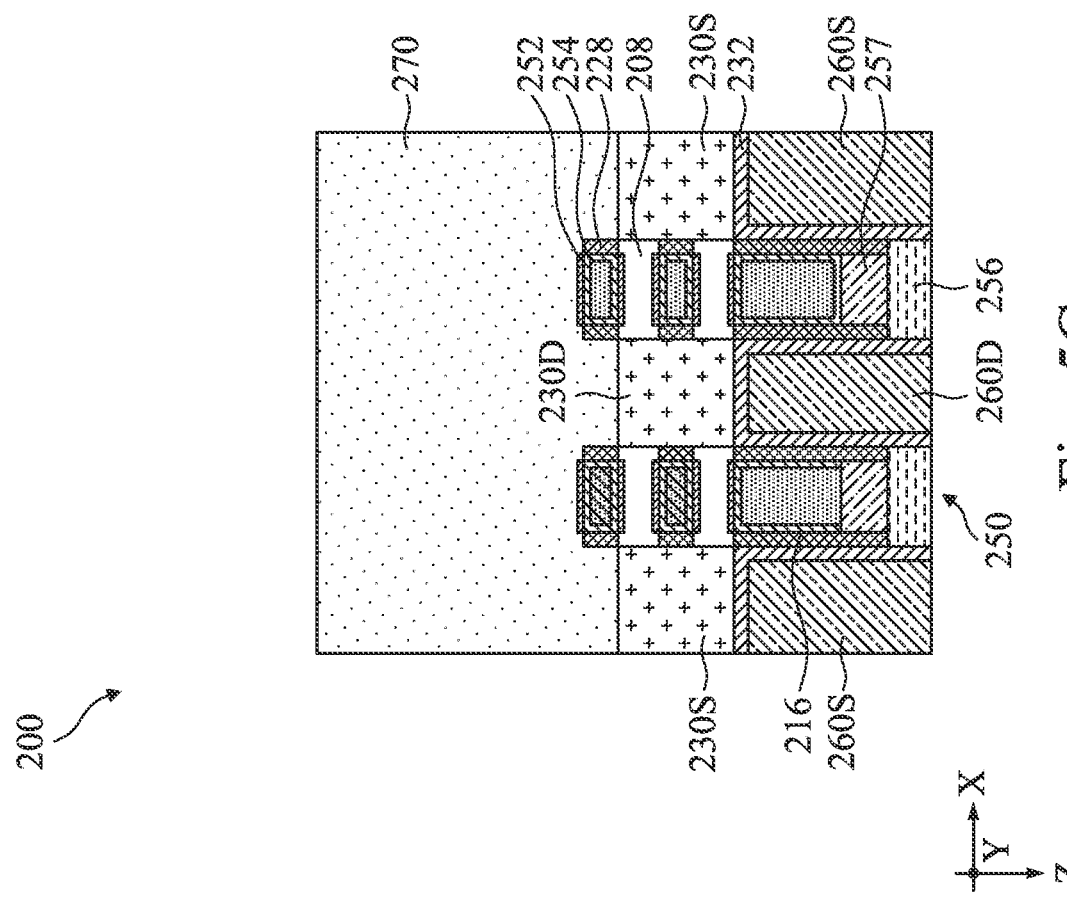
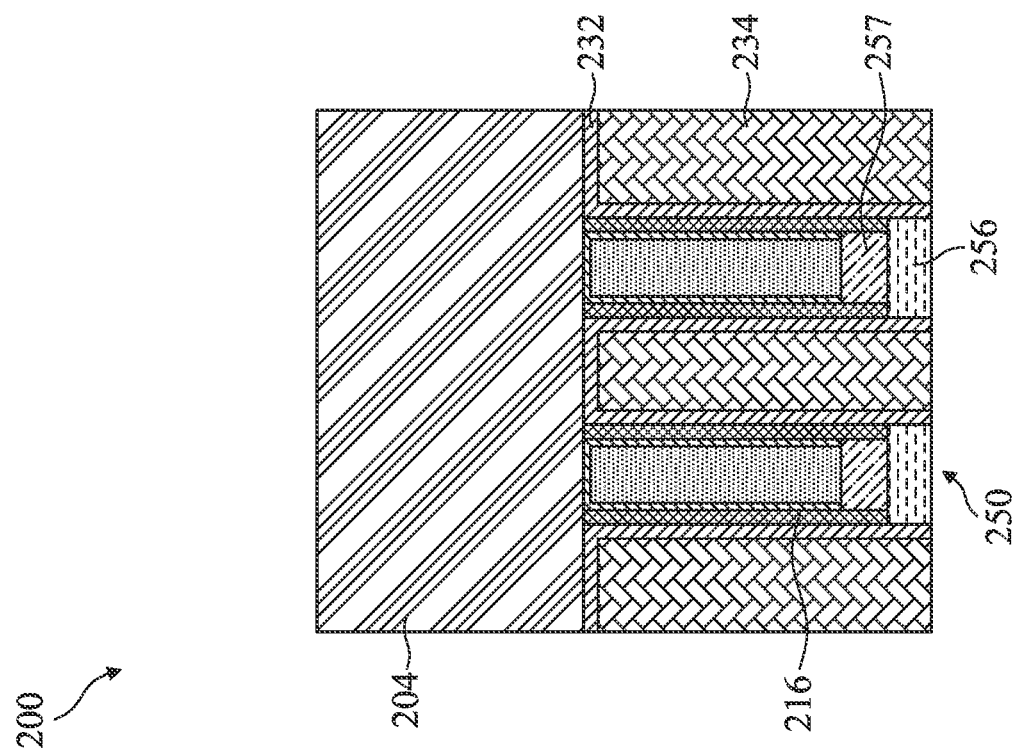

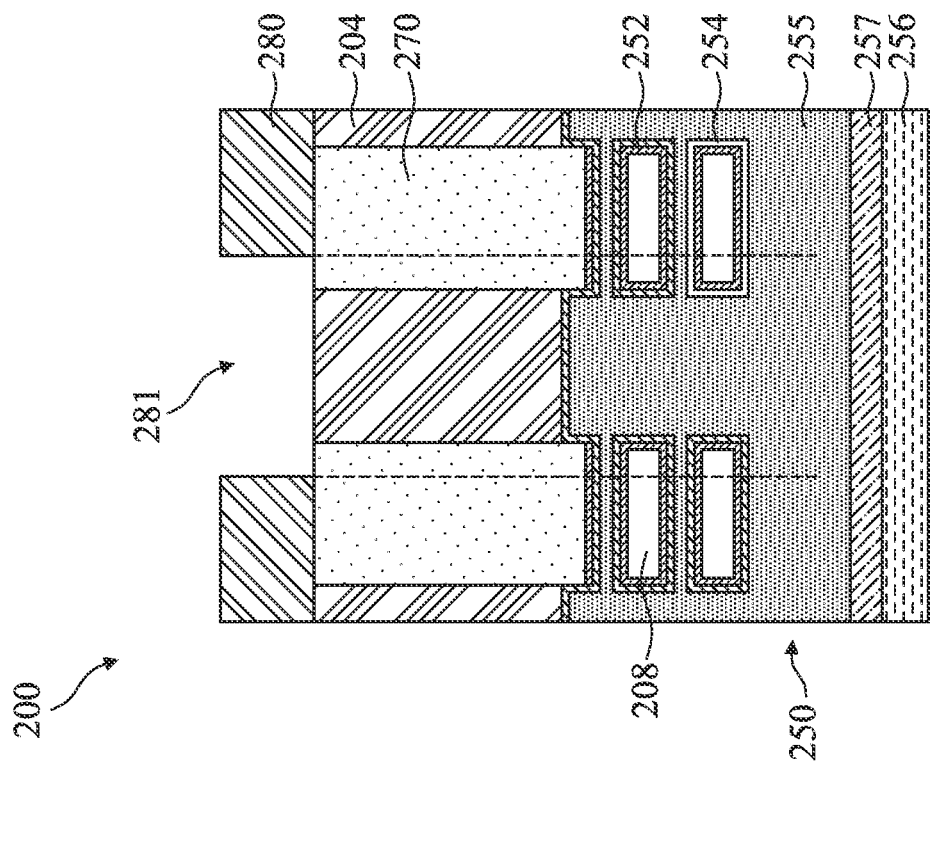
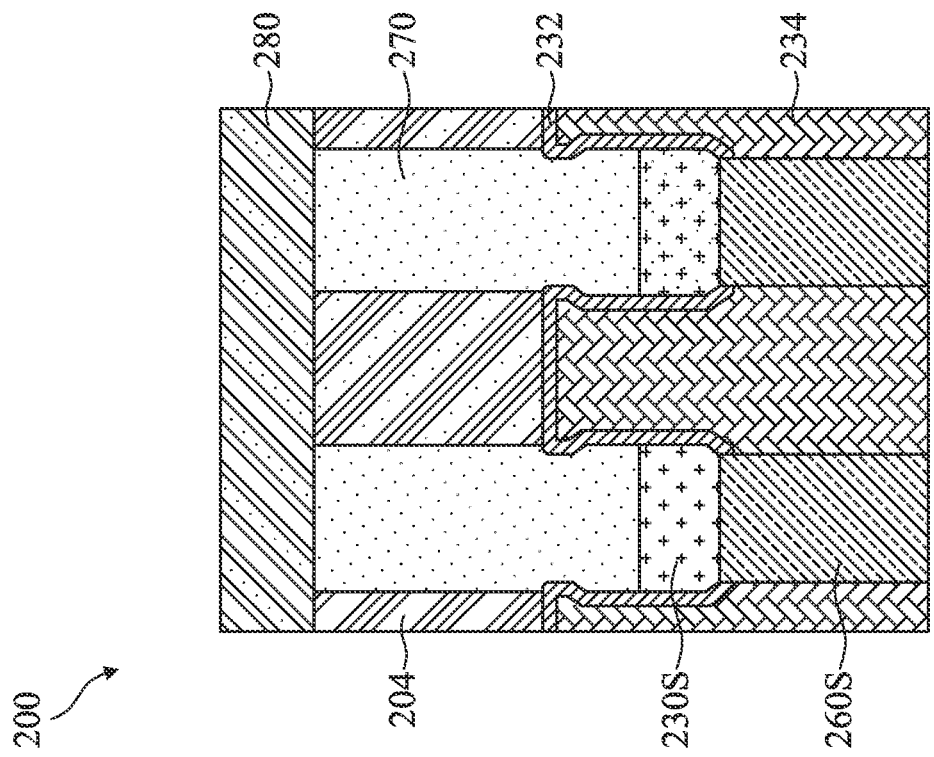
Fig. 6E
Fig. 6D

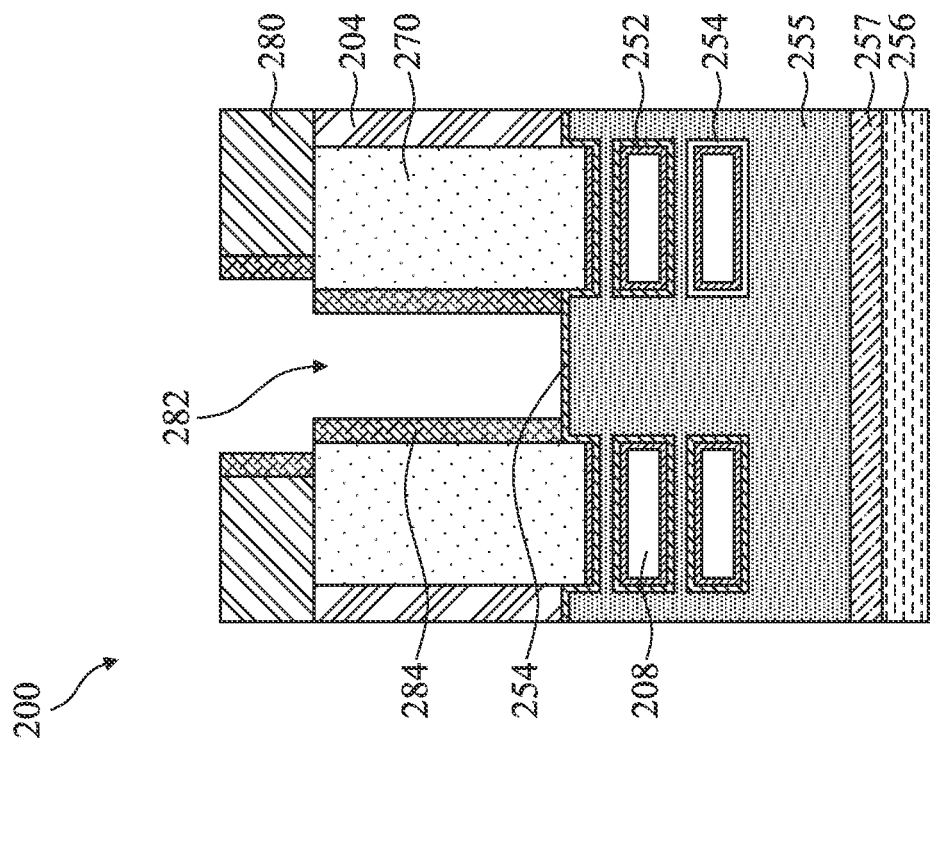
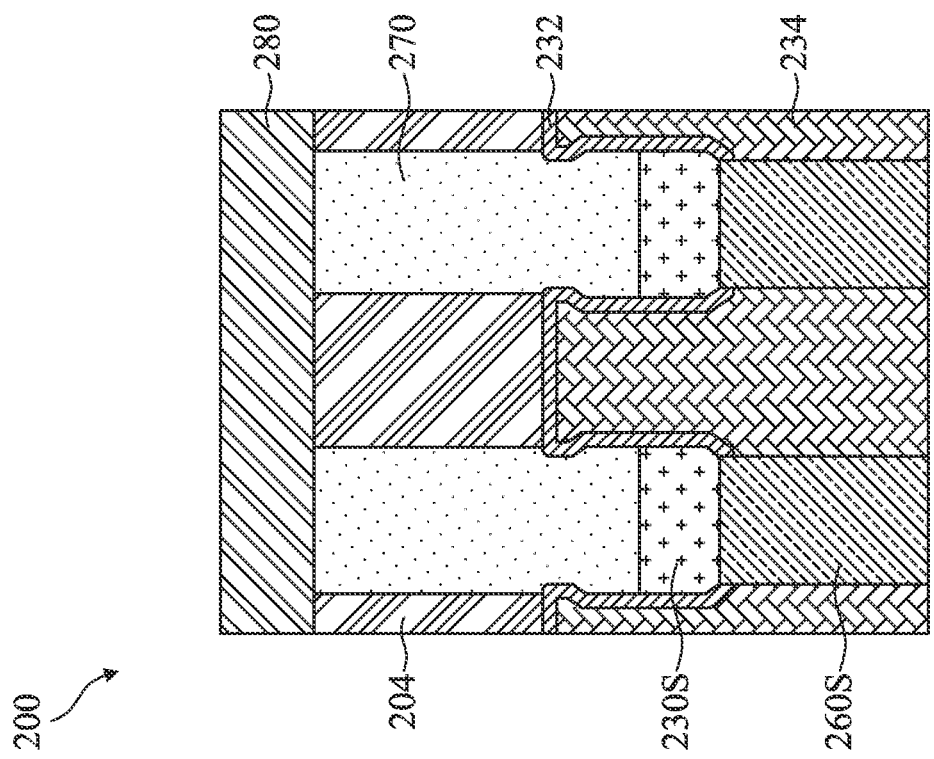
Fig. 8E
Fig. 8D

SEMICONDUCTOR DEVICE WITH GATE CUT STRUCTURE AND METHOD OF FORMING THE SAME

PRIORITY DATA

This application claims priority to U.S. Provisional Patent Application No. 63/142,304, filed on Jan. 27, 2021, entitled "Semiconductor Device with Gate Cut Structure and Method of Forming the Same", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As integrated circuit (IC) technologies progress towards smaller technology nodes, it is more and more difficult to ensure satisfactory mask overlay. For example, some gate cut features include a top portion and a bottom portion that are formed sequentially using a series of lithography and etch processes. When the mask alignment is less than ideal, the top portion may not land on the bottom portion. Therefore, while existing gate cut features and formation processes thereof are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2B, 2C, 2D, 2E, 3B, 3C, 3D, 3E, 4B, 4C, 4D, 4E, 5B, 5C, 5D, 5E, 6B, 6C, 6D, 6E, 7B, 7C, 7D, 7E, 8B, 8C, 8D, 8E, 9B, 9C, 9D, 9E, 10B, 10C, 10D, and 10E illustrate fragmentary cross-sectional views in the respective perspectives of a workpiece during a fabrication process according to the method of FIG. 1, according to one or more aspects of the present disclosure.

DETAILED DESCRIPTION

Figure 1:
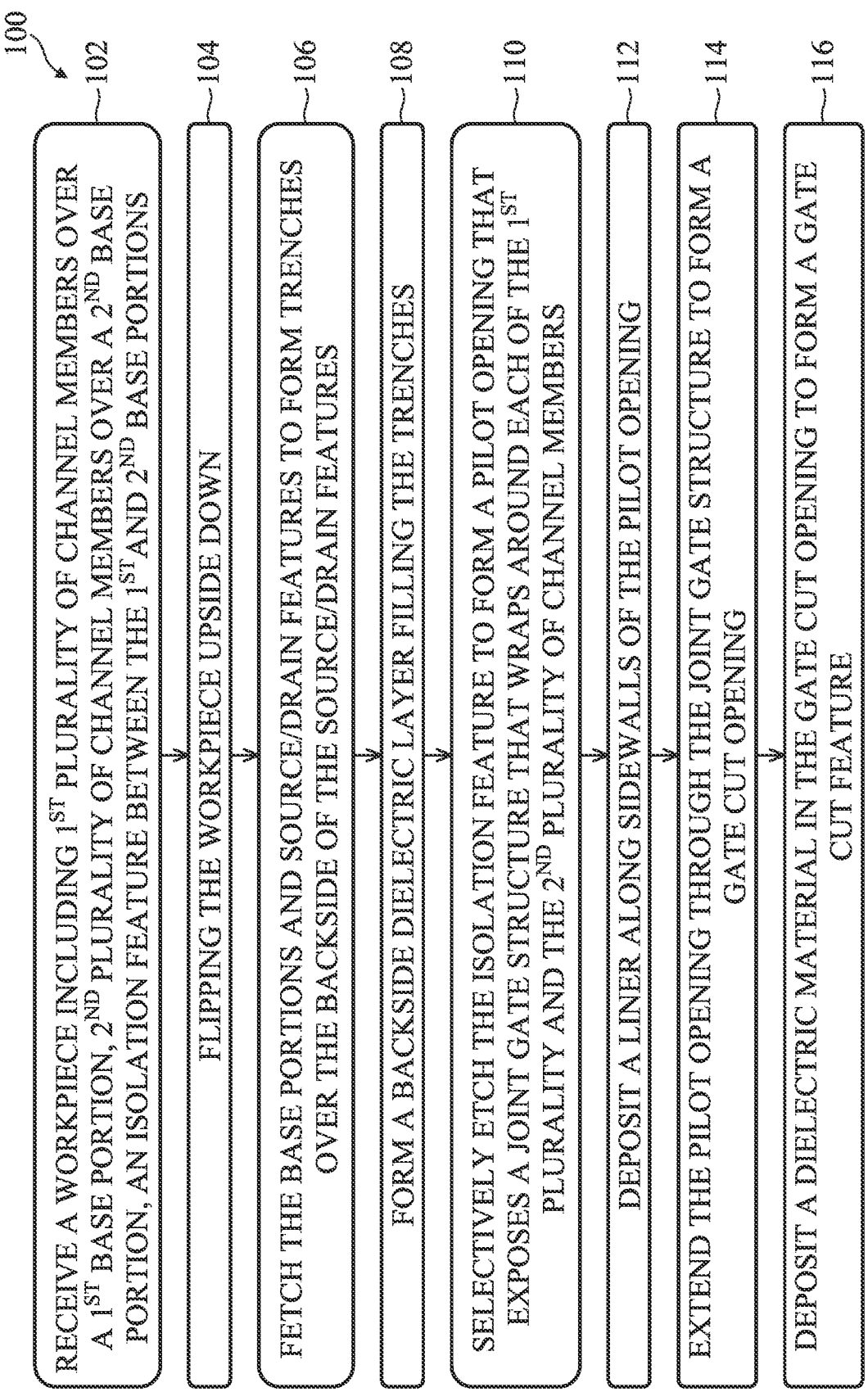
FIG. 1 illustrates a flow chart of a method for forming a semiconductor device with a gate cut feature formed from a backside of the semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In semiconductor fabrication, cut metal gate (CMG) process refers to a process for forming a dielectric feature to divide a continuous gate structure that spans over more than one active region into two or more segments. Such a dielectric feature may be referred to as a gate cut feature or a cut feature. In some existing CMG processes, a gate cut feature is formed on a dielectric fin (or a hybrid fin). With the gate cut feature on top and the dielectric fin on bottom, they work in synergy to separate a gate structure into two segments. In some example processes, the gate cut feature is formed using photolithography and etch processes from a front side (or frontside) of a substrate (such as a wafer). As the scaling down of semiconductor device continues, it becomes increasingly difficult to form the gate cut feature squarely on a dielectric fin due to overlay and critical dimension uniformity (CDU) limitations. In some instances, the gate cut feature that misses the dielectric fin may cut into the gate structure or the channel region, resulting in defects.

The present disclosure provides CMG processes that, unlike existing technologies, forms a cut feature from a back side (or backside) of the substrate. Additionally, the cut feature according to the present disclosure extends from the backside of the substrate through the gate structure. That is, the cut feature of the present disclosure alone divides the gate structure into segments without help from a dielectric fin or a hybrid fin. In some instances, the cut feature of the present disclosure may even extend horizontally through more than one gate structures or extend vertically through one or more dielectric features or layers over the gate structure. Processes of the present disclosure are not only formed from the backside but are also self-aligned to avoid defects associated with mask misalignment. Embodiments of the present disclosure may continue the scaling down of cell heights while maintaining or increasing the process window.

The various aspects of the present disclosure will now be described in more details with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during, or after method 100, and some steps described can be replaced, eliminated, or moved around for additional embodiments of the method. Not all steps are described herein in detail for reasons of simplicity. Method 100 is described below in conjunction with FIGS. 2A-10A, 2B-10B, 2C-10C, 2D-10D, 2E-10E, and 11-23, which are fragmentary perspective and cross-sectional views of a workpiece 200 at different stages of fabrication according to embodiments of method 100. Among FIGS. 2A-10A, 2B-10B, 2C-10C, 2D-10D, and 2E-10E, figures ending with A are perspectives of the workpiece 200; figures ending with B are fragmentary cross-sectional views along cross-section B-B' in the respective perspective view; figures ending with C are fragmentary cross-sectional views along cross-section C-C' in the respective perspective view; figures ending with D are fragmentary cross-sectional views along cross-section D-D' in the respective perspective view; and figures ending with E are fragmentary cross-sectional views along cross-section E-E' in the respective perspective view. Because the workpiece 200 will be fabricated into a semiconductor device upon conclusion of the fabrication processes, the workpiece 200 may be referred to as the semiconductor device (or device) 200 as the context requires. Additionally, throughout the present application, like reference numerals denote like features, unless otherwise excepted.

Embodiments of the present disclosure may be implemented to advance semiconductor devices that may include multi-gate devices. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Embodiments of the present disclosure are described using an MBC transistor structure, which is for illustration purpose only and should not be construed as limiting the scope of the present disclosure.

Figure 2A:
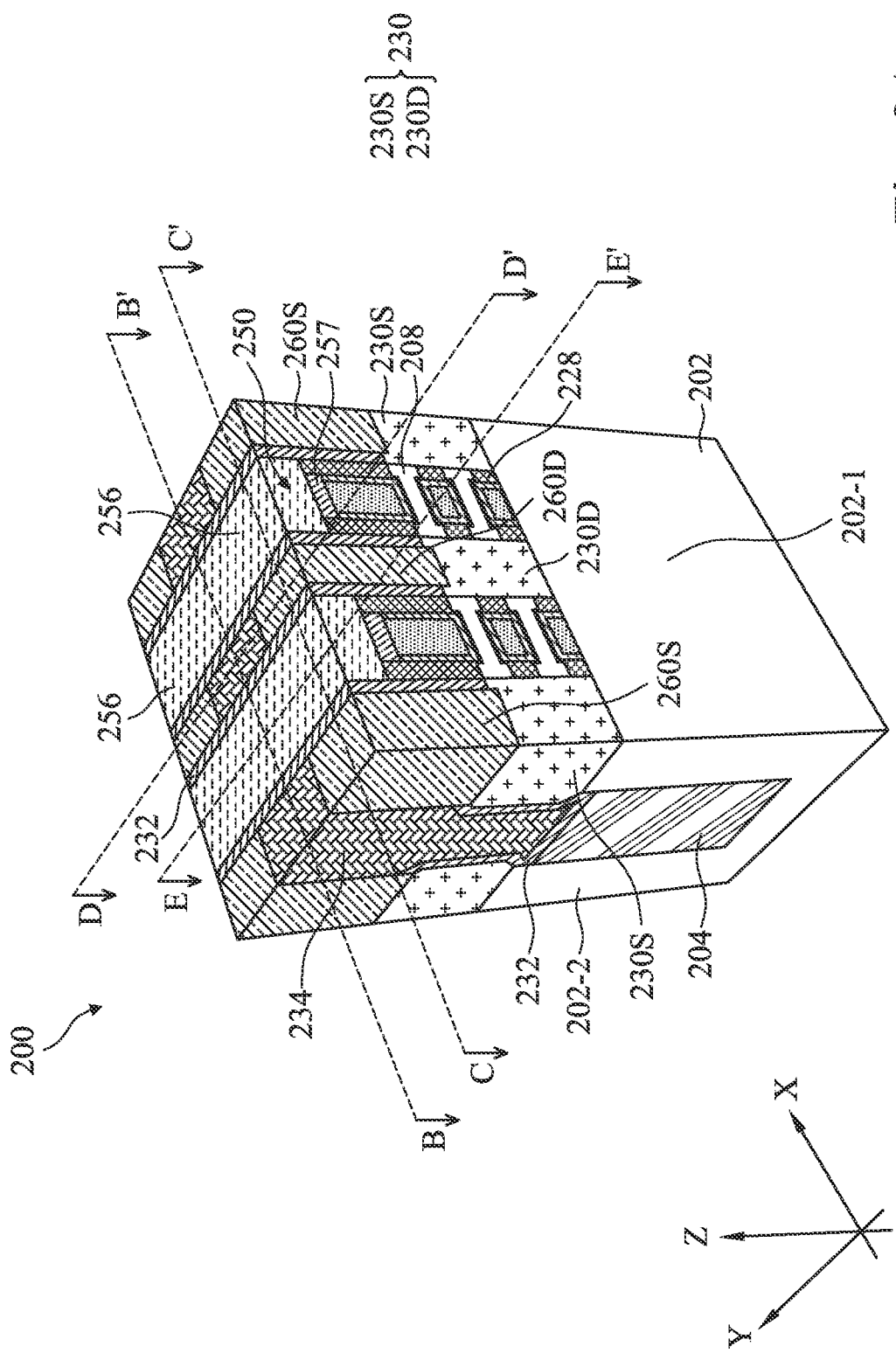
FIGS. 2A, 3A, 4A, 5A, 6A, 7A, 8A, 9A, and 10A illustrate fragmentary perspective views of a workpiece during a fabrication process according to the method of FIG. 1, according to one or more aspects of the present disclosure.
Figure 2C:
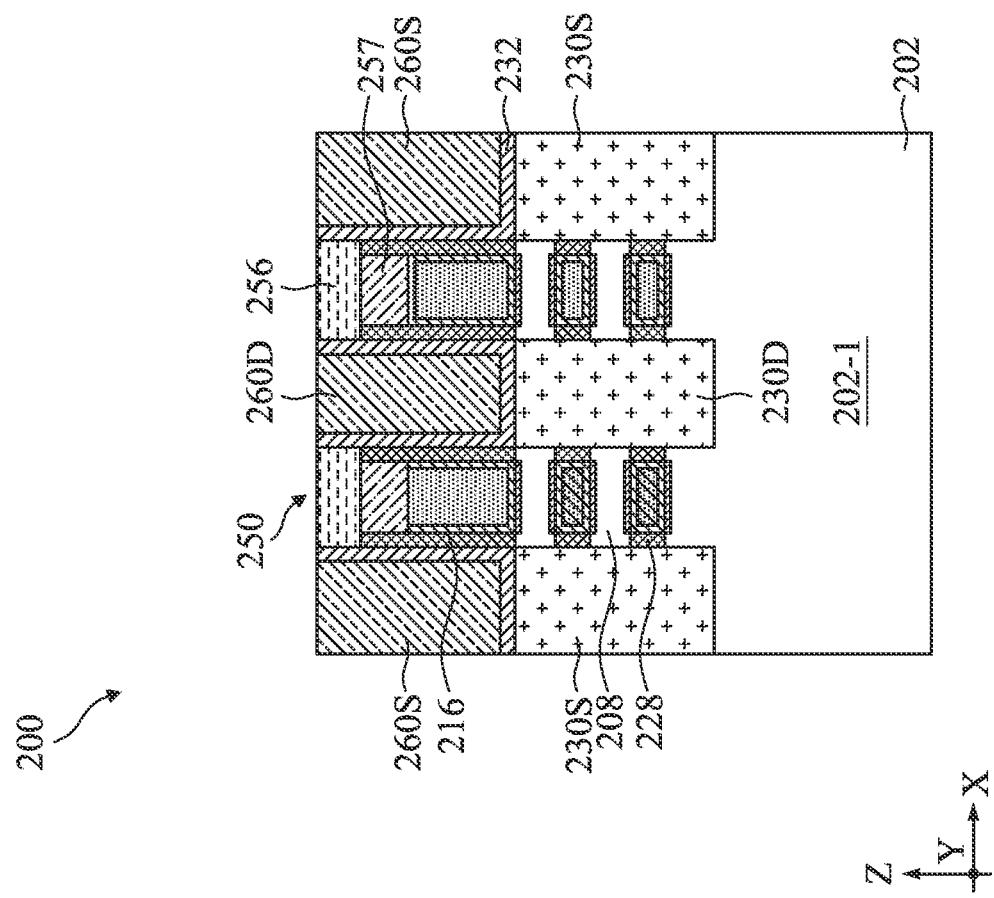
Figure 2B:
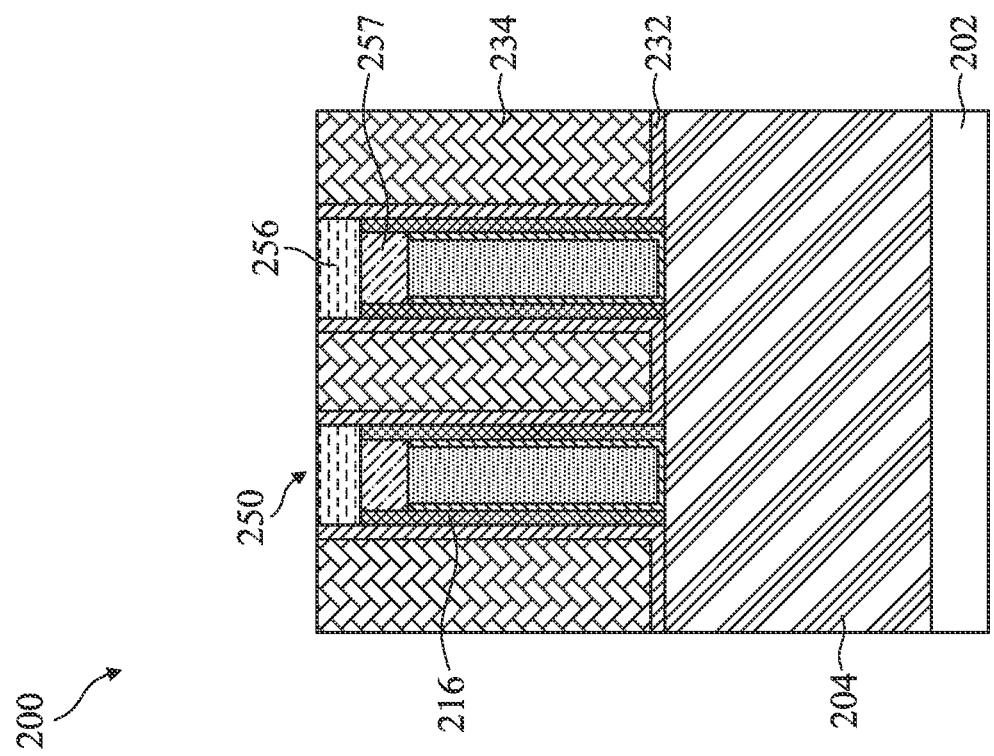
Figure 2E:
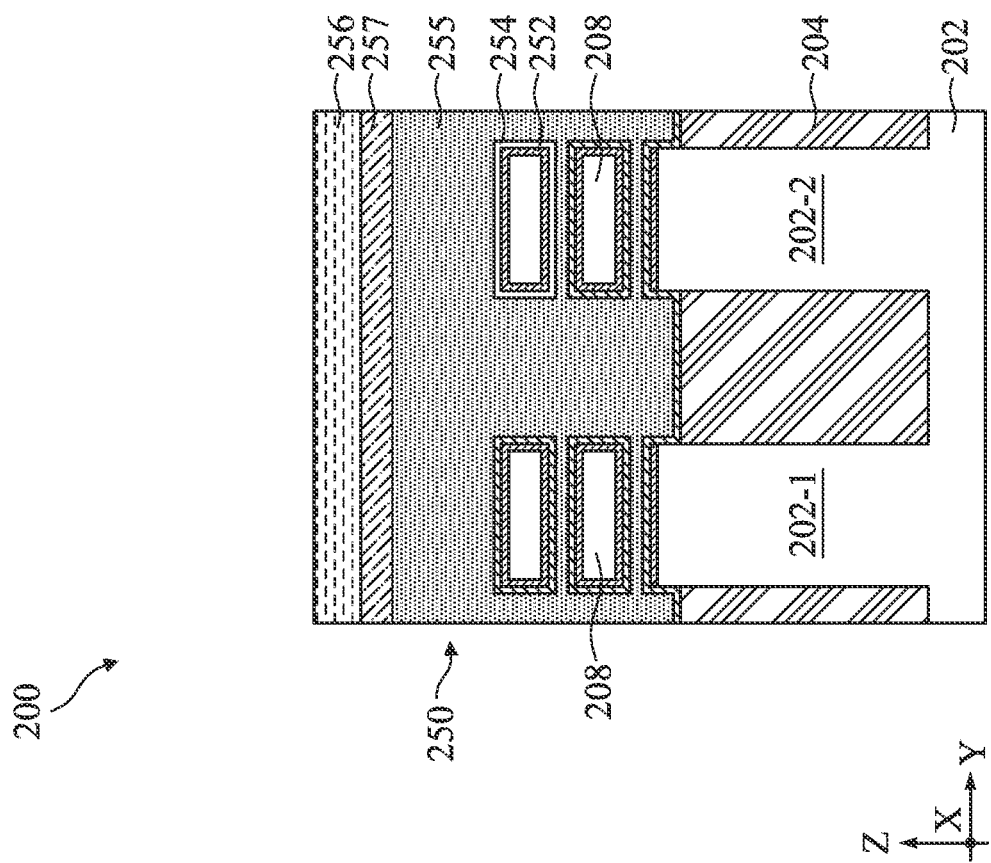

Referring to FIGS. 1 and 2A-2E, method 100 includes a block 102 where a workpiece 200 is received. FIGS. 2A-2E illustrate a workpiece 200 with its frontside facing up. That is, no backside processes have been yet performed to the workpiece 200 shown in FIGS. 2A-2E. The workpiece 200 includes a substrate 202. In one embodiment, the substrate 202 includes silicon (Si). In other embodiments, the substrate 202 may also include other semiconductor materials such as germanium (Ge), silicon carbide (SiC), silicon germanium (SiGe), or diamond. The workpiece 200 includes a first base portion 202-1 and a second base portion 202-2, each of which is patterned from the substrate 202 and may share the same composition as the substrate 202. While the substrate 202 is shown in FIGS. 2A-2E, it may be omitted from at least some of the other figures for simplicity. Referring to FIG. 2E, the first base portion 202-1 and the second base portion 202-2 are spaced apart from one another by an isolation feature 204. In some embodiments, the isolation feature 204 is deposited in trenches between the base portions 202-1 and 202-2 and surrounds the base portions 202-1 and 202-2. The isolation feature 204 may also be referred to as a shallow trench isolation (STI) feature 204. The isolation feature 204 may include silicon oxide, silicon oxynitride, fluorine-doped silicate glass (FSG), a low-k dielectric, combinations thereof, and/or other suitable materials.

Referring to FIG. 2E, the workpiece 200 includes a plurality of vertically stacked channel members 208 over the first base portion 202-1 and another plurality of vertically stacked channel members 208 over the second base portion 202-2. In the depicted embodiments, two (2) vertically stacked channel members 208 are disposed over each of the first base portion 202-1 and the second base portion 202-2, which is for illustrative purposes only and not intended to be limiting beyond what is specifically recited in the claims. The channel members 208 may be formed of a semiconductor material that is similar to the material of the substrate 202. In one embodiment, the channel members 208 may include silicon (Si). Channel members 208 over the first base portion 202-1 and the second base portion 202-2 are wrapped around by a joint gate structure 250 that extends along the Y direction. Each of the joint gate structures 250 may include an interfacial layer 252 over and wrapping around the channel members 208, a gate dielectric layer 254 over and wrapping around the interfacial layer 252 and a gate electrode layer 255 over and wrapping around the gate dielectric layer 254. In some embodiments, the interfacial layer 252 includes silicon oxide. The gate dielectric layer 254 may also be referred to a high-k dielectric layer, as it is formed of a dielectric material having a dielectric constant greater than that of silicon dioxide, which is about 3.9. The gate dielectric layer 254 may include hafnium oxide. Alternatively, the gate dielectric layer 254 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material.

The gate electrode layer 255 may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer 255 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Referring to FIGS. 2A-2C, the workpiece 200 includes a gate spacer 216 disposed along sidewalls of the joint gate structures 250 above the topmost channel member 208 or above the isolation feature 204. The gate spacer 216 may be a single layer or a multilayer. In some embodiments, the gate spacer 216 may include silicon oxide, silicon nitride, silicon carbide, silicon oxynitride, silicon carbonitride, silicon oxycarbide, silicon oxycarbonitride, and/or combinations thereof. Between two adjacent channel members 208, sidewalls of the gate structures are lined by inner spacer features 228. The inner spacer features 228 may include silicon oxide, silicon nitride, silicon oxycarbide, silicon oxycarbonitride, silicon carbonitride, metal nitride, or a suitable dielectric material. With respect to each of the first base portion 202-1 and the second base portion 202-2, each vertical stack of channel members 208 extends between a source feature 230S and a drain feature 230D (collectively as source/drain features 230). One end surface of each of the channel members 208 is coupled to a source feature 230S and the other end surface of each of the channel members 208 is coupled to a drain feature 230D. Depending on the conductivity type of the to-be-formed MBC transistor, the source feature 230S and the drain feature 230D may be n-type or p-type. When they are n-type, they may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). When they are p-type, they may include germanium (Ge), gallium-doped silicon germanium (SiGe: Ga), boron-doped silicon germanium (SiGe:B), or other suitable material and may be in-situ doped during the epitaxial process by introducing a p-type dopant, such as boron (B) or gallium (Ga). Notably, in the illustrated embodiment, each of the source feature 230S and the drain feature 230D is directly disposed on the base portions 202-1 and 202-2 with no other sacrificial features formed therebetween, such as there is no a sacrificial source/drain plug that reserves a space for forming a backside source/drain contact in some alternative embodiments. As to be explained in further details below, without a need for forming backside conductive features, process window during backside etching processes can be enlarged.

Figure 2D:
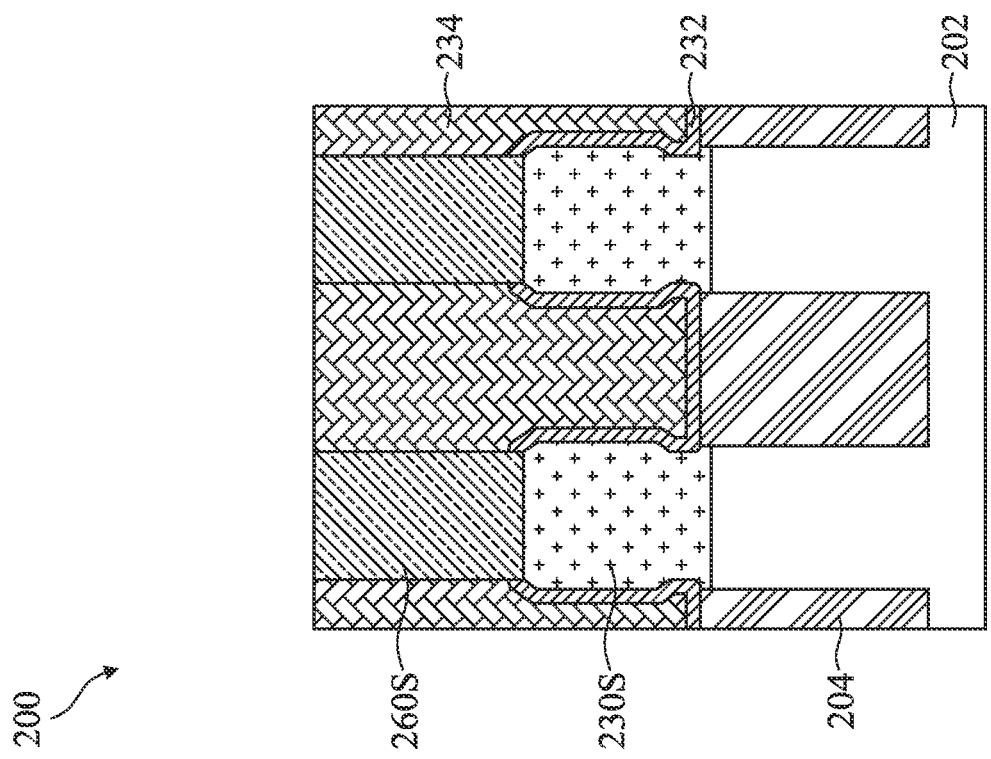
Figure 3A:
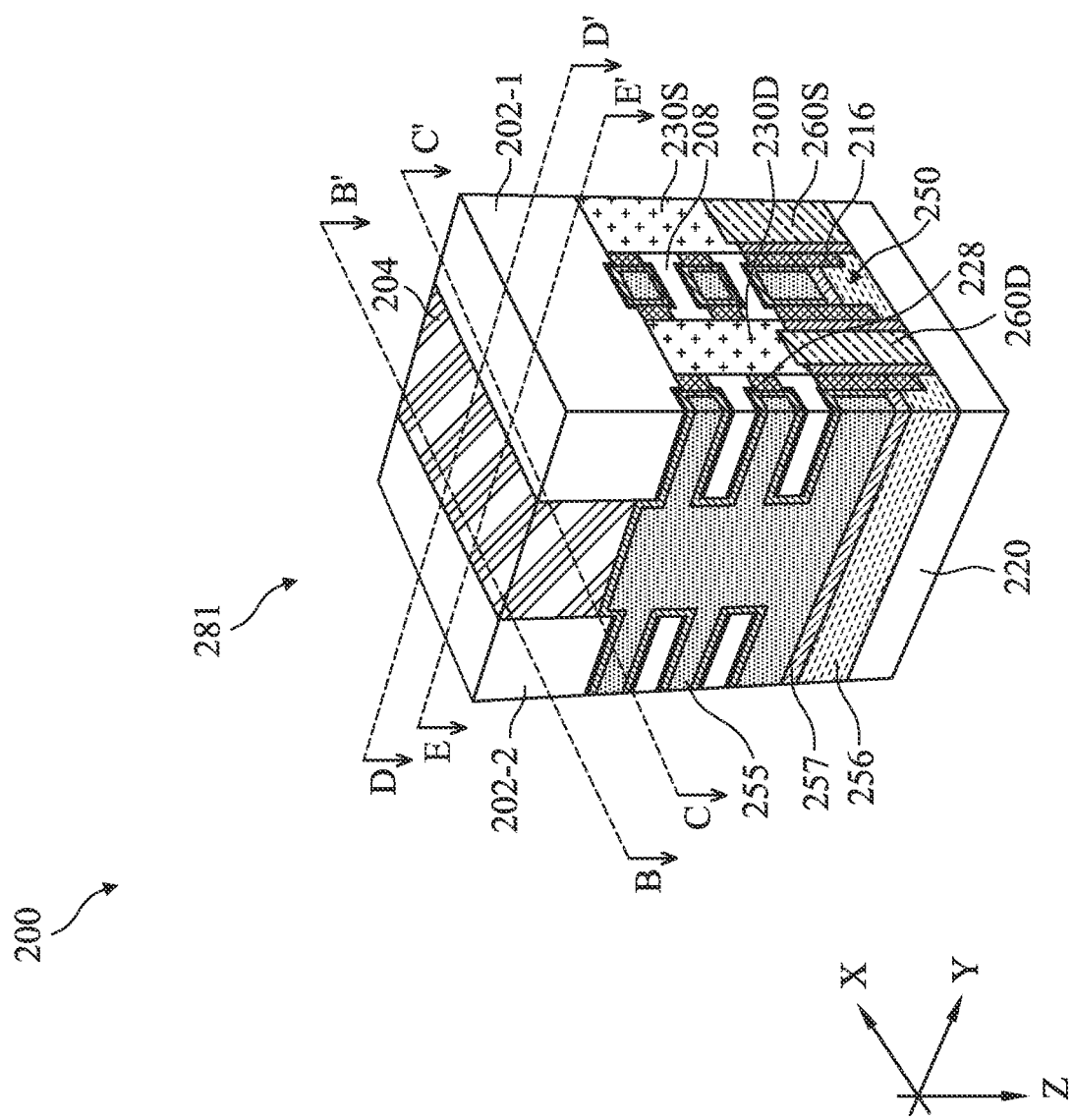
Figure 3C:
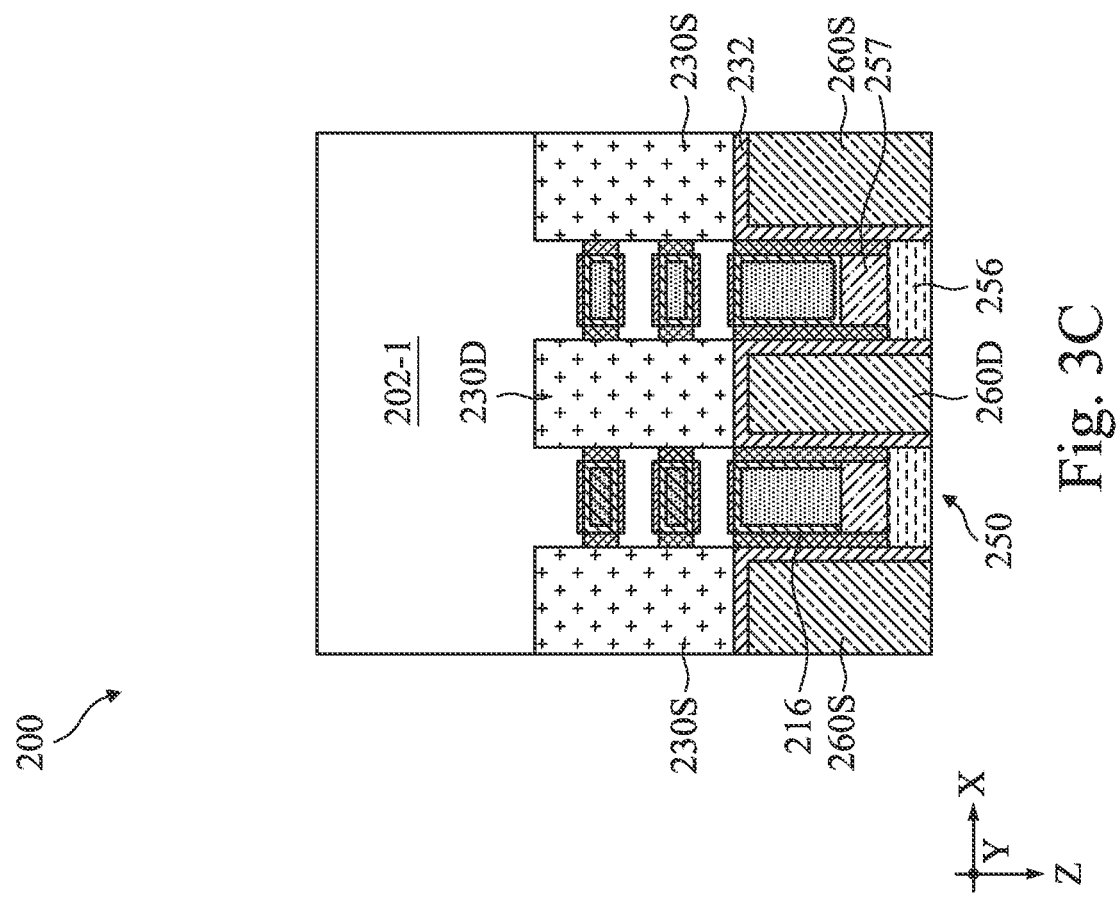
Figure 3B:
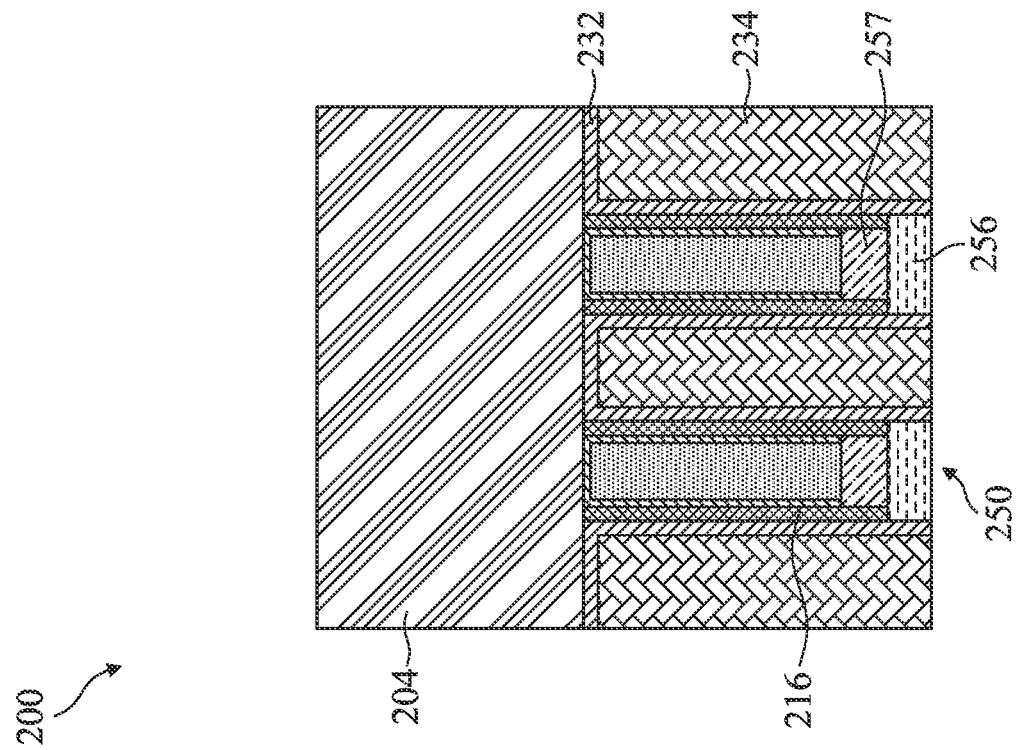
Figure 3E:
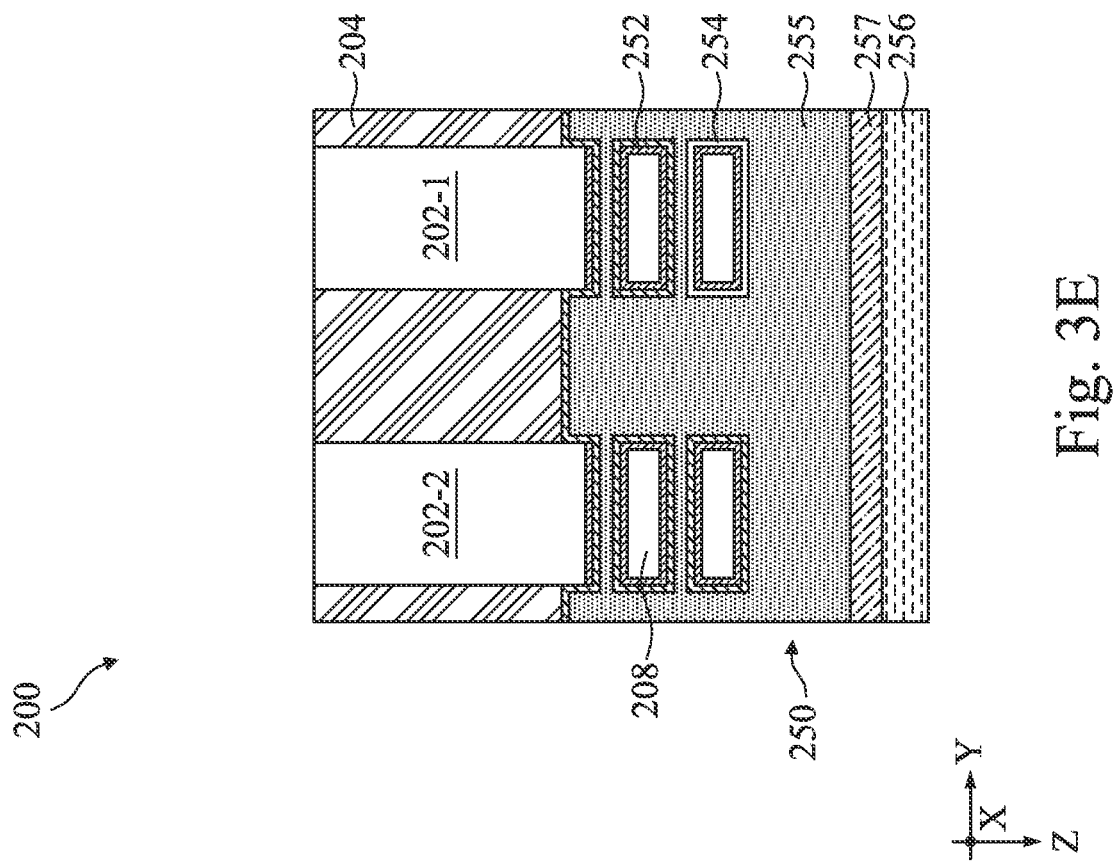
Figure 3D:
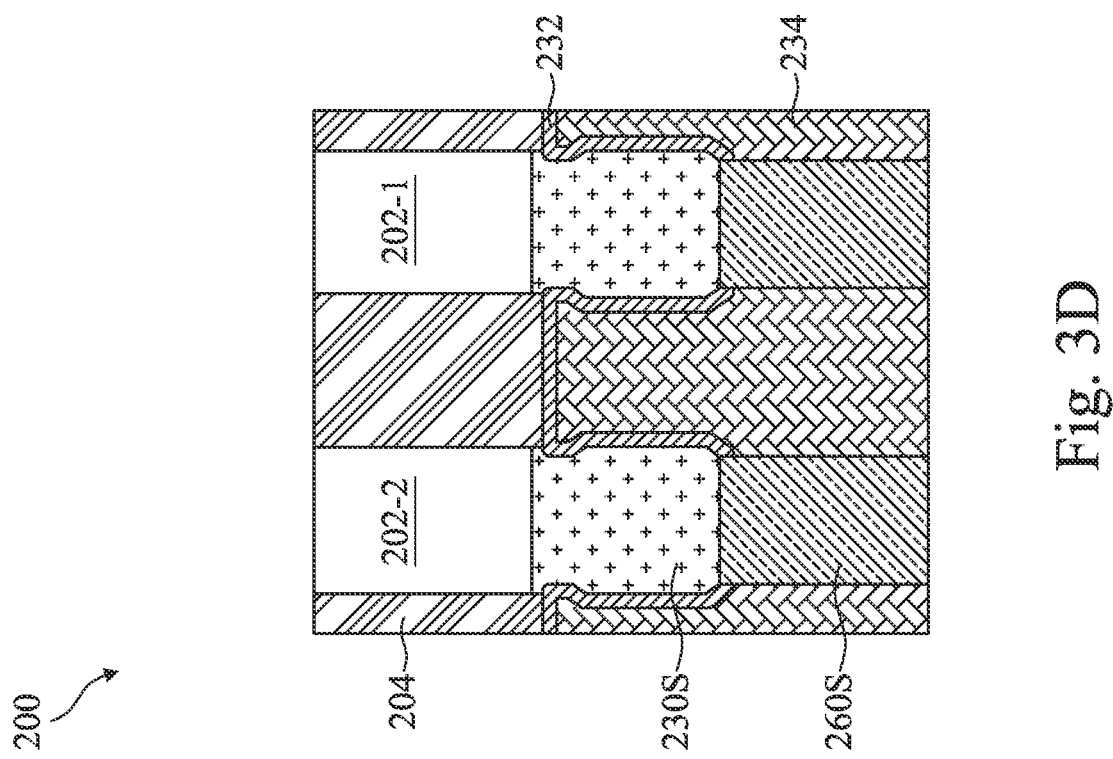

Reference is made to FIGS. 2A, 2C and 2D. The workpiece 200 also includes a contact etch stop layer (CESL) 232 disposed over the source feature 230S and the drain feature 230D, and an interlayer dielectric (ILD) layer 234 disposed over the CESL 232. The CESL 232 may include silicon nitride, silicon oxynitride, and/or other materials known in the art. The ILD layer 234 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

In some embodiments represented in FIGS. 2A, 2B, 2C, and 2E, the workpiece 200 includes a gate self-aligned contact (SAC) dielectric layer 256. In some instances, the gate SAC dielectric layer 256 may be disposed over the joint gate structure 250 and the gate spacer 216. The gate SAC dielectric layer 256 may be a single layer or a multi-layer and may include silicon oxide, silicon nitride, silicon carbide, silicon oxynitride, silicon carbonitride, silicon oxycarbide, silicon oxycarbonitride, and/or combinations thereof. In some instances, the workpiece 200 further includes a gate capping layer 257 disposed between the joint gate structure 250 and the gate SAC dielectric layer 256. In one embodiment, the gate capping layer 257 includes one or more conductive materials, such as tungsten. The gate capping layer 257 prevents the dielectric materials in the gate SAC dielectric layer 256 from contacting work function metals in the gate electrode layer 255. In the illustrated embodiment, the gate capping layer 257 is not disposed over but surrounded by the gate spacer 216. The gate capping layer 257 may be formed by recessing the joint gate structures 250, depositing one or more conductive materials over the recessed joint gate structures 250, and performing a CMP process to the one or more conductive materials. The workpiece 200 may also include frontside source contacts 260S over source features 230S and frontside drain contacts 260D over drain features. The frontside source contacts 260S or the frontside drain contacts 260D may include titanium nitride (TiN), tantalum (Ta), titanium (Ti), tantalum nitride (TaN), ruthenium (Ru), tungsten (W), cobalt (Co), aluminum (Al), molybdenum (Mo), titanium silicide (TiSi), tungsten silicon (WSi), platinum silicide (PtSi), cobalt silicide (CoSi), nickel silicide (NiSi), or a combination thereof.

Referring to FIGS. 1 and 3A-3E, method 100 includes a block 104 where the workpiece 200 is flipped upside down. To flip the workpiece 200 up-side-down, a carrier substrate 220 is bonded to a frontside of the workpiece 200 away from the substrate 202. In some embodiments, the carrier substrate 220 may be bonded to the workpiece 200 by fusion bonding, by use of an adhesion layer, or a combination thereof. In some instances, the carrier substrate 220 may be formed of semiconductor materials (such as silicon), sapphire, glass, polymeric materials, or other suitable materials. In embodiments where fusion bonding is used, the carrier substrate 220 includes a bottom oxide layer and the workpiece 200 includes a top oxide layer. After both the bottom oxide layer and top oxide layer are treated, they are placed in plush contact with one another for direct bonding at room temperature or at an elevated temperature. Once the carrier substrate 220 is bonded to the workpiece 200, the workpiece 200 is flipped over, as shown in FIGS. 3A-3E. For simplicity, FIGS. 3B-3E omit some features that are already shown in FIG. 3A, such as the carrier substrate 220. The carrier substrate 220 may also be omitted from at least some of the other figures for simplicity. After the workpiece 200 is flipped over, the backside of the workpiece 200 is planarized using chemical mechanical polishing (CMP) until the isolation feature 204, the first base portion 202-1, and the second base portion 202-2 are exposed on the backside of the workpiece 200, which is now facing up.

Figure 4A:
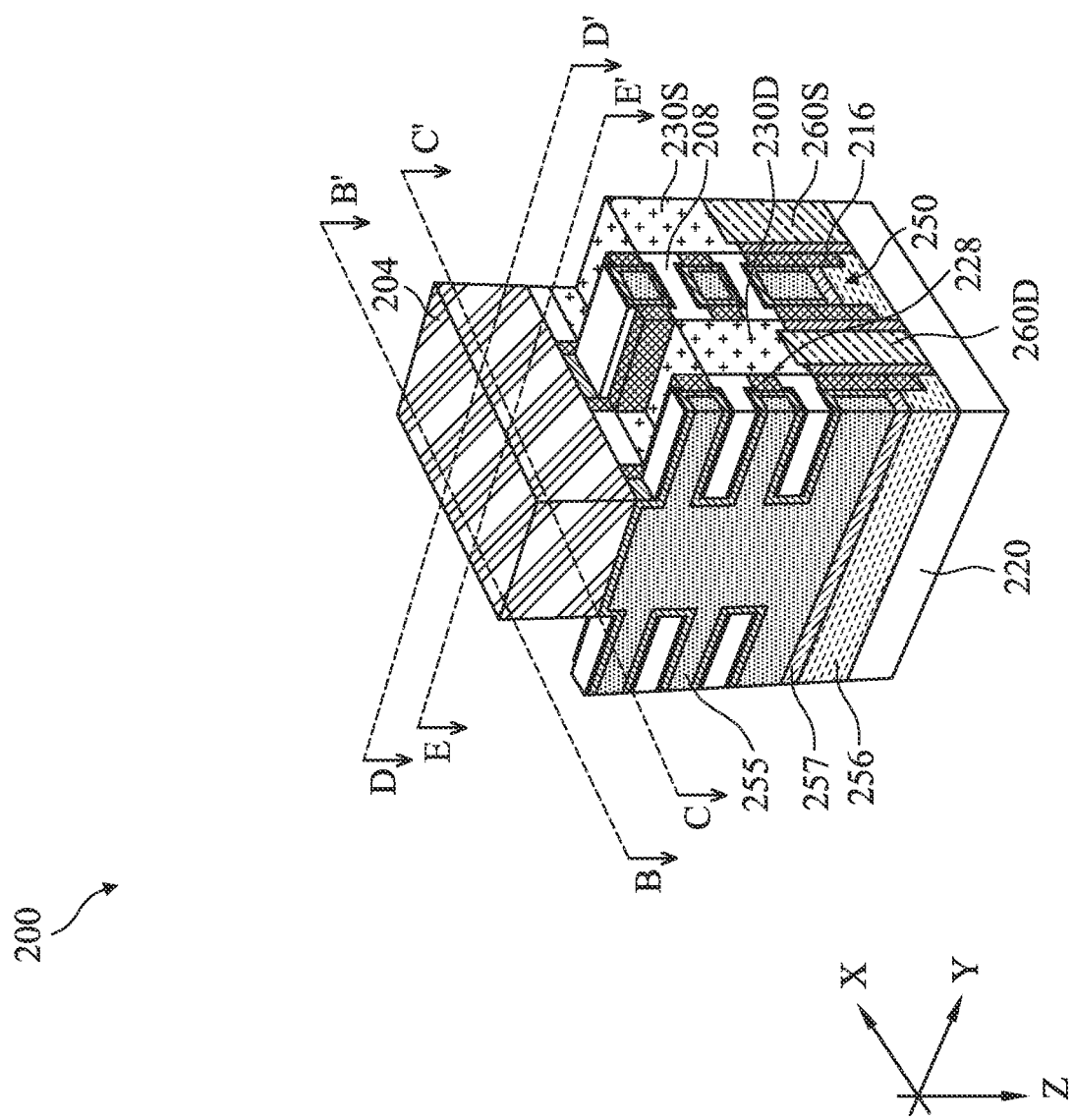
Figure 4C:
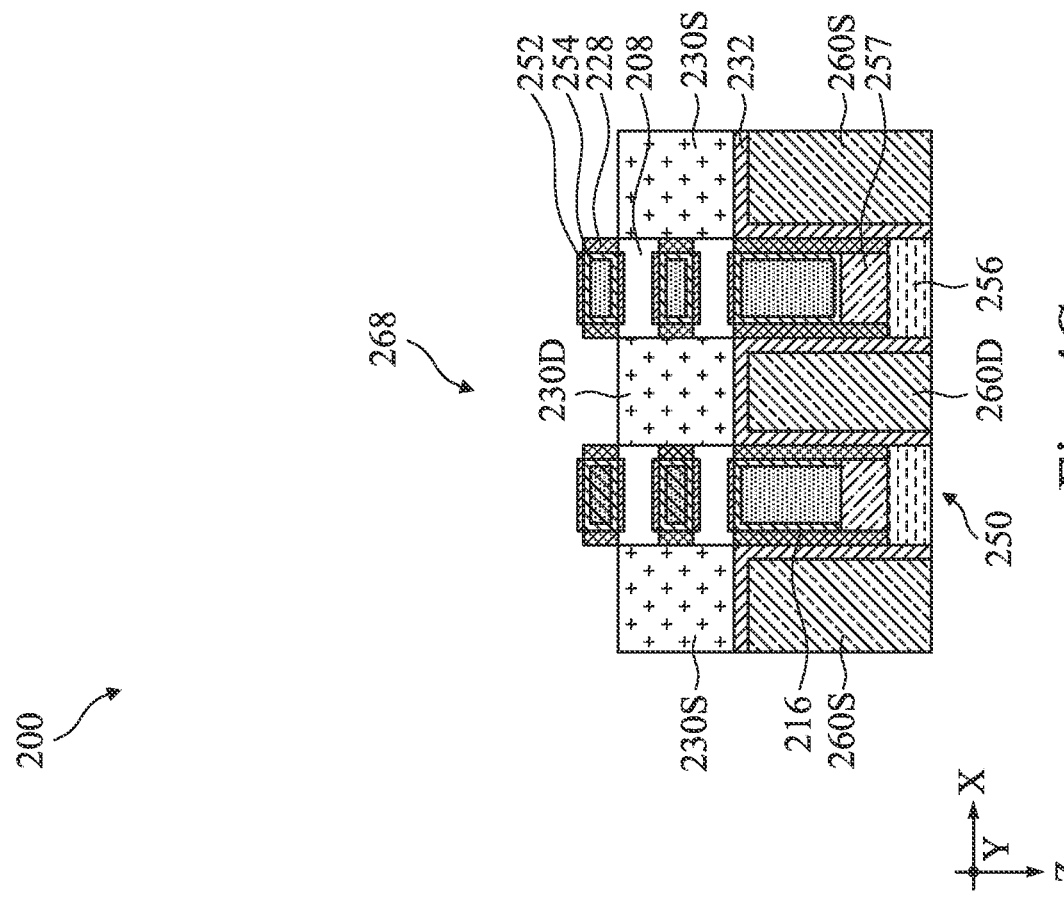
Figure 4B:
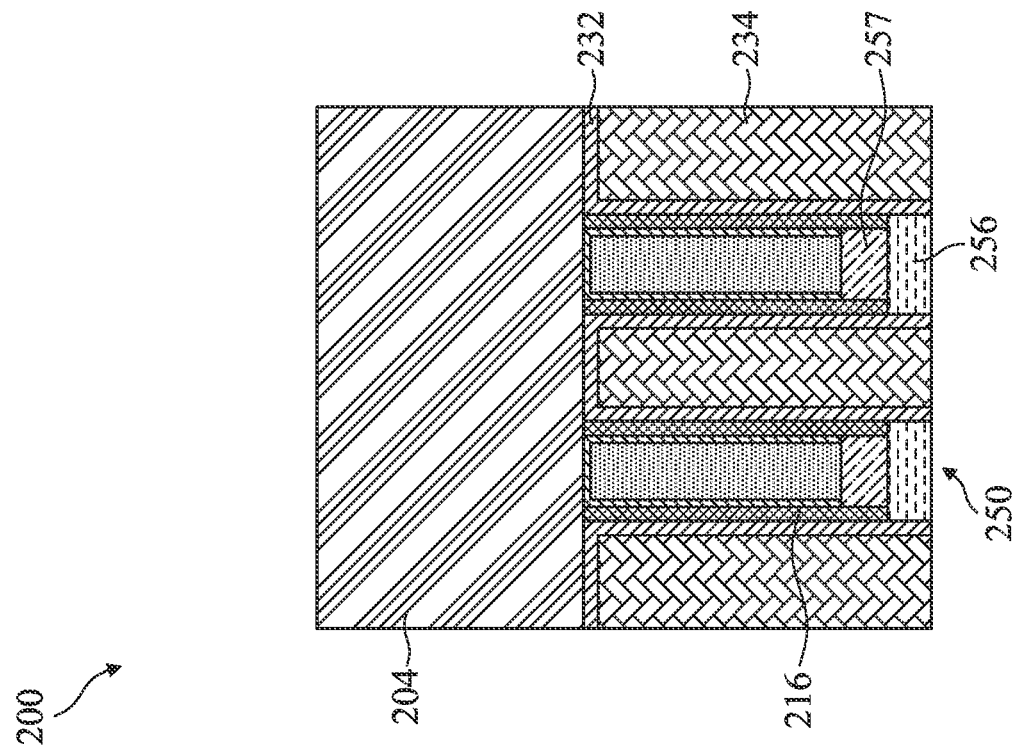
Figure 4E:
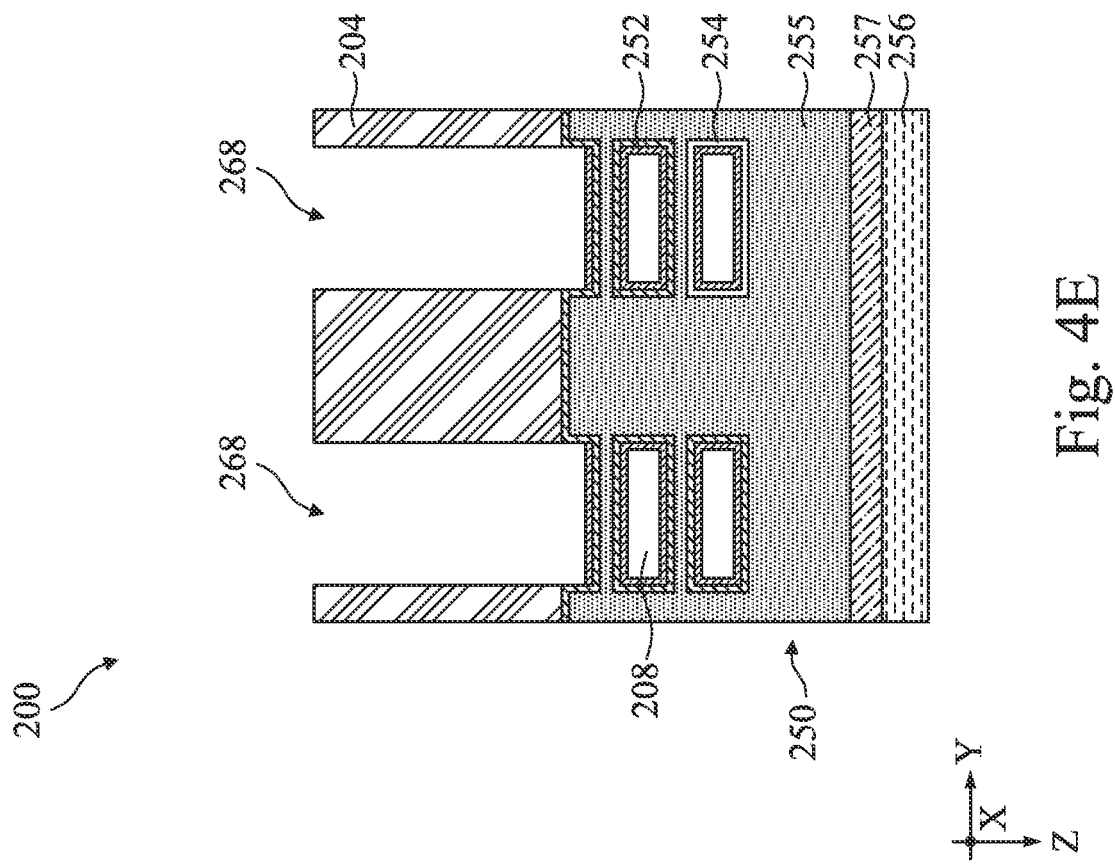
Figure 4D:
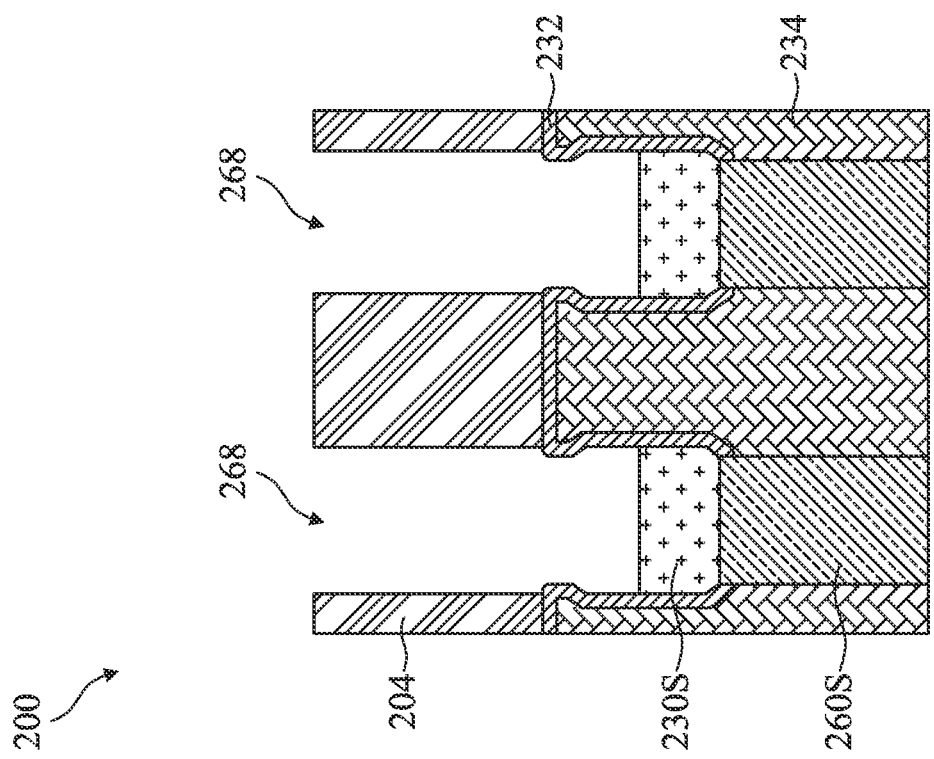
Figure 5A:
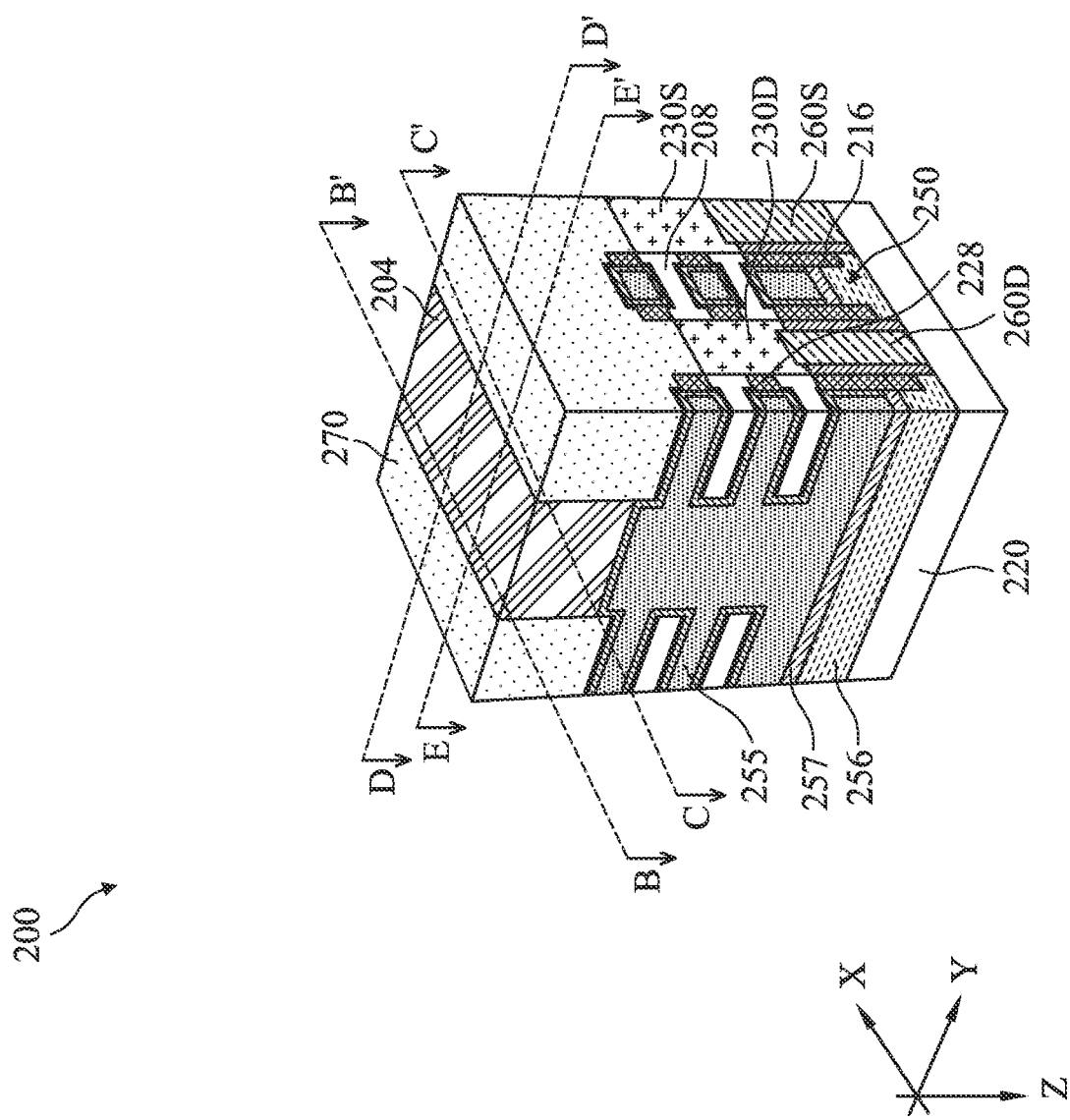
Figure 5E:
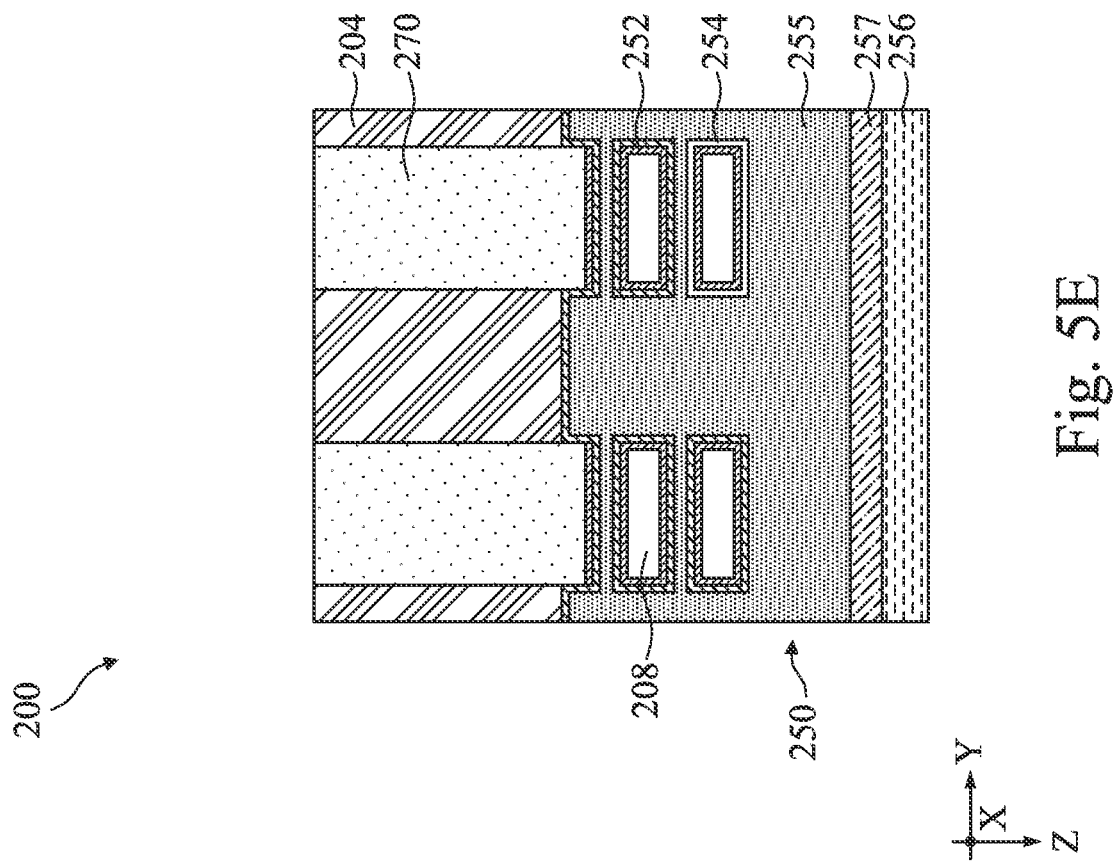
Figure 5D:
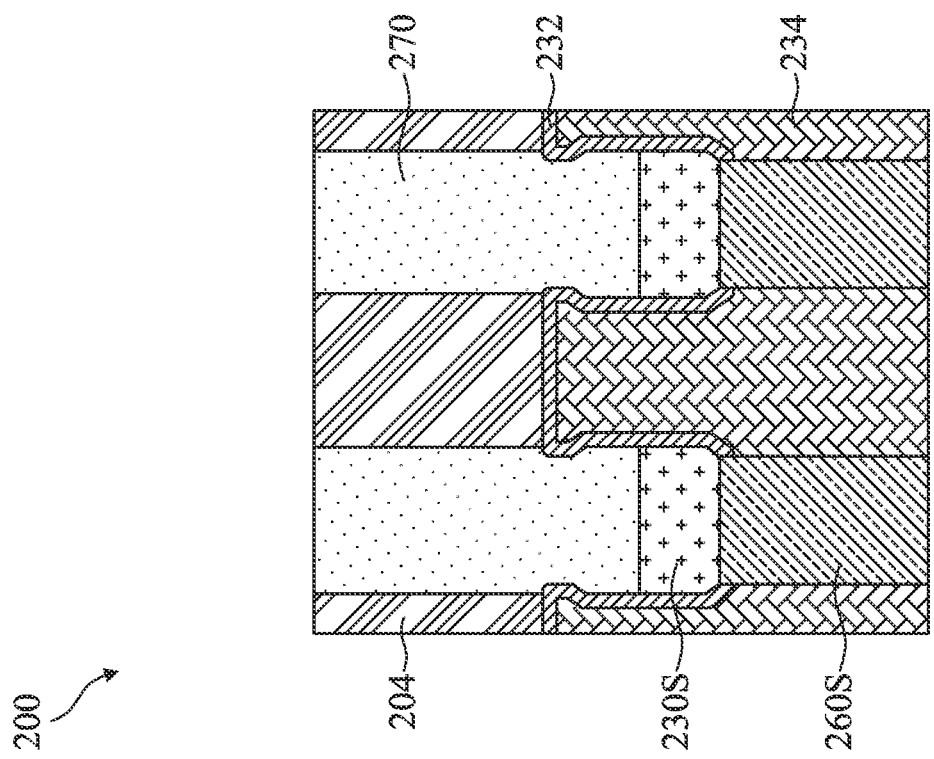
Figure 6A:
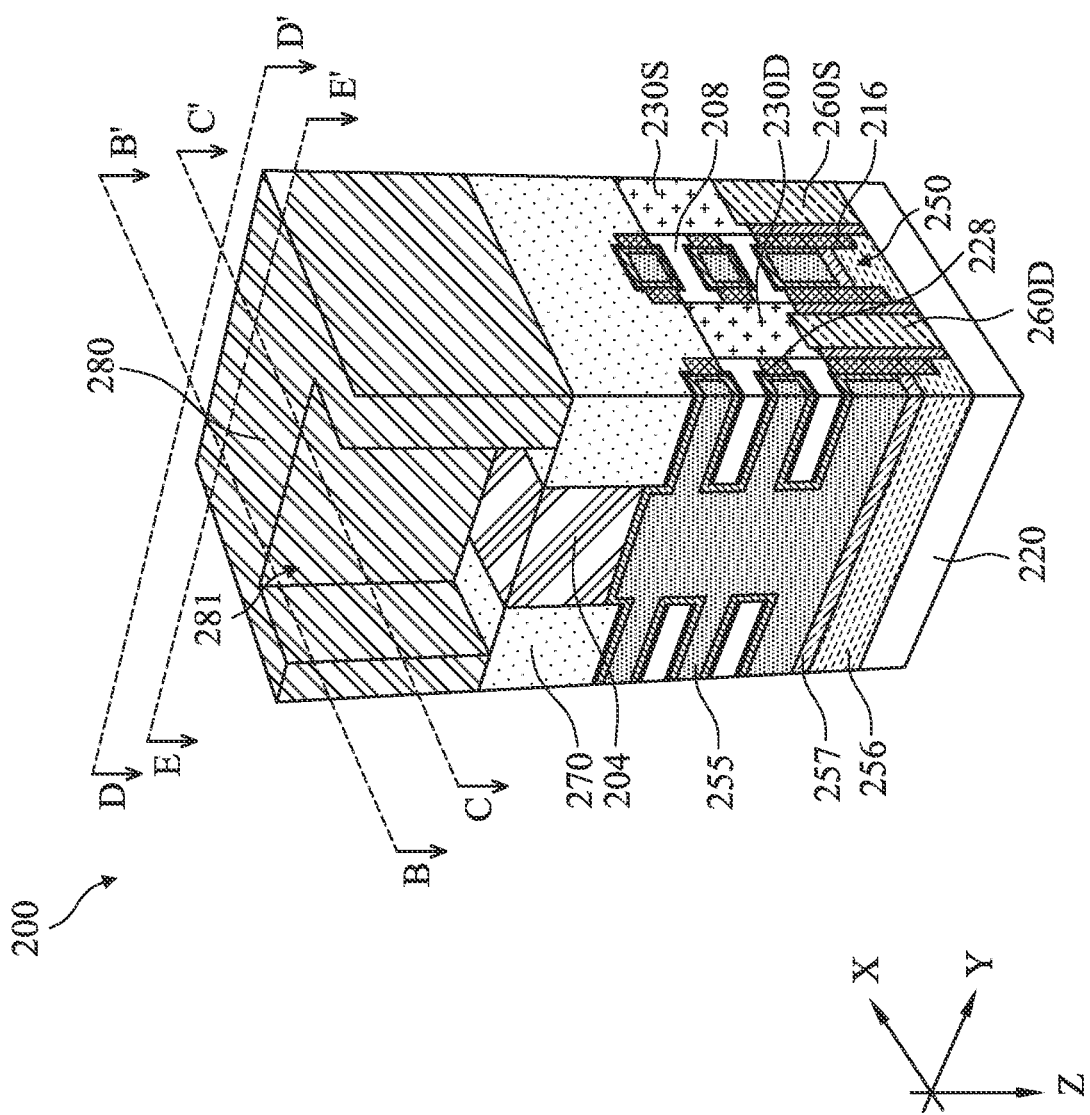
Figure 6C:
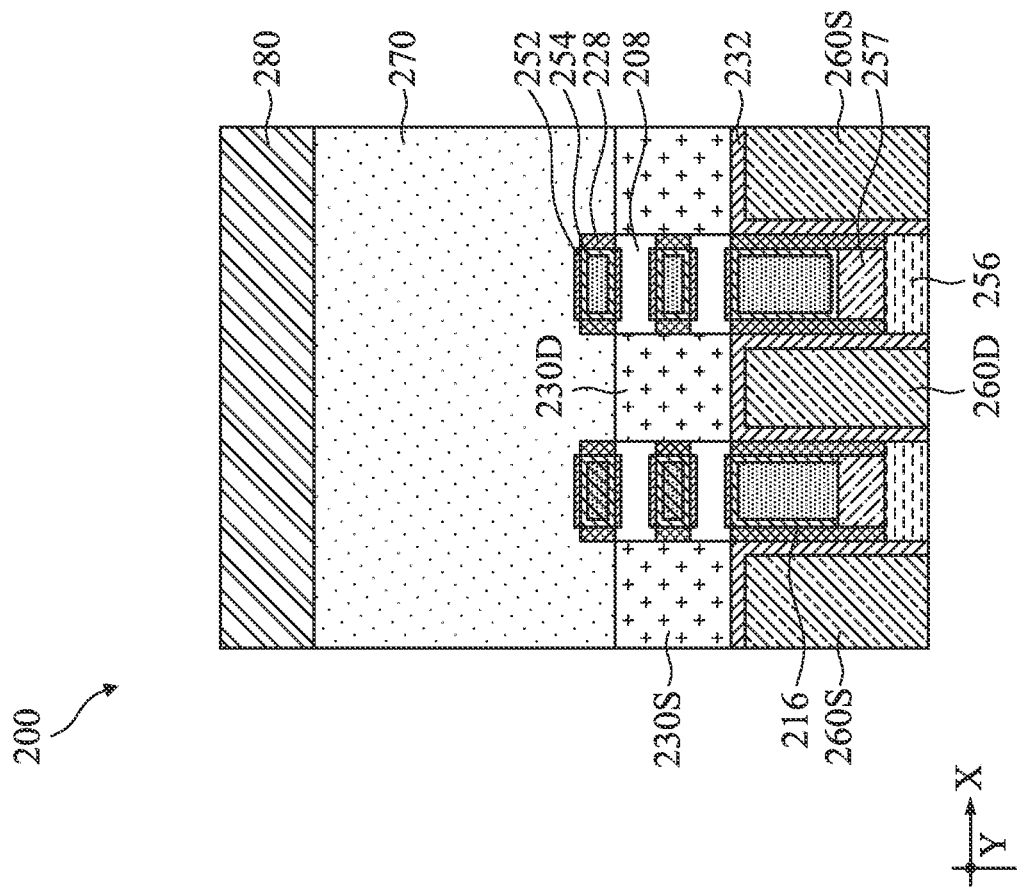
Figure 6B:
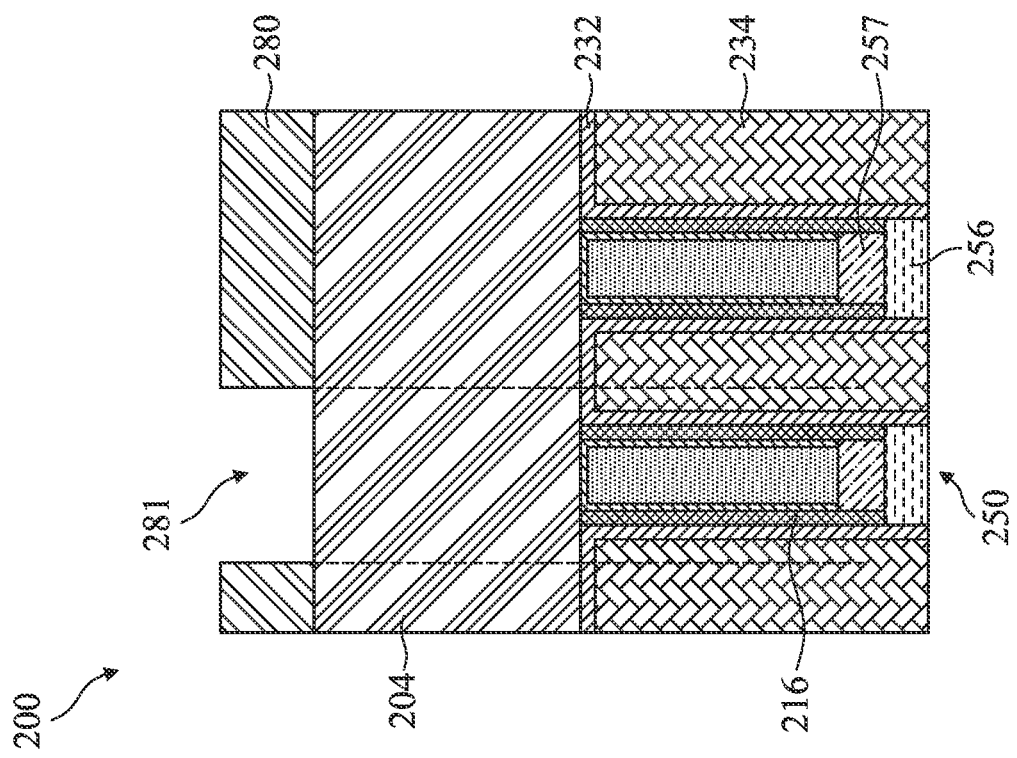
Figure 14:
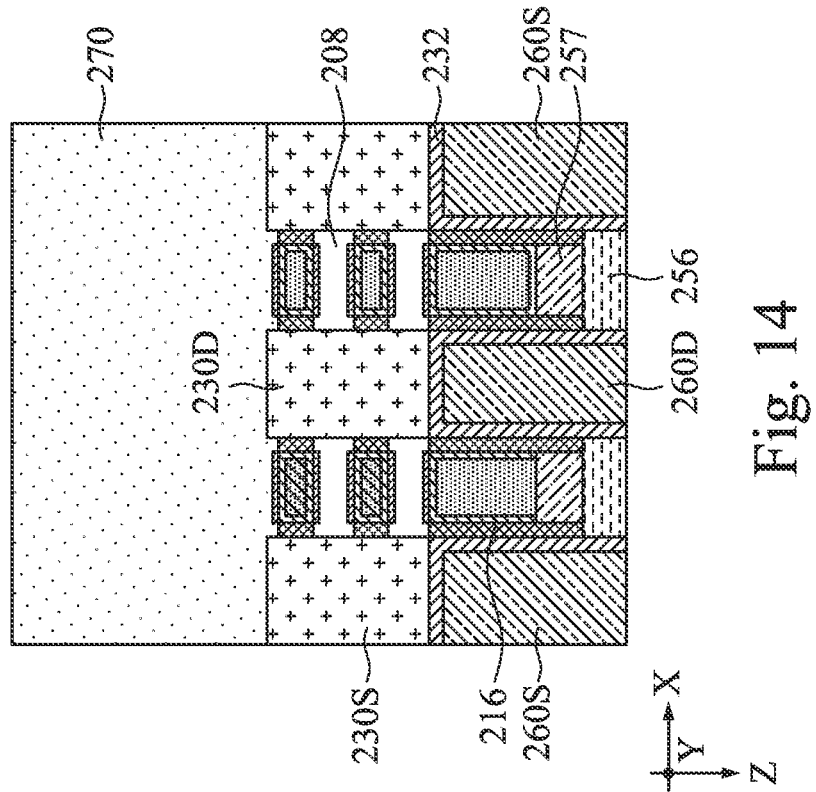
Figure 13:
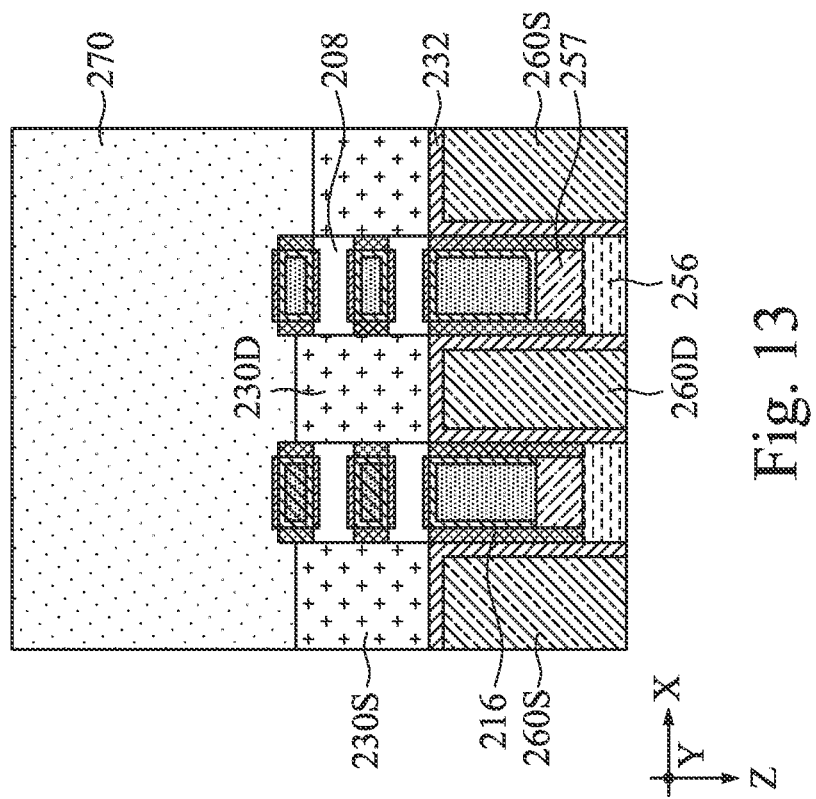
Figure 15:
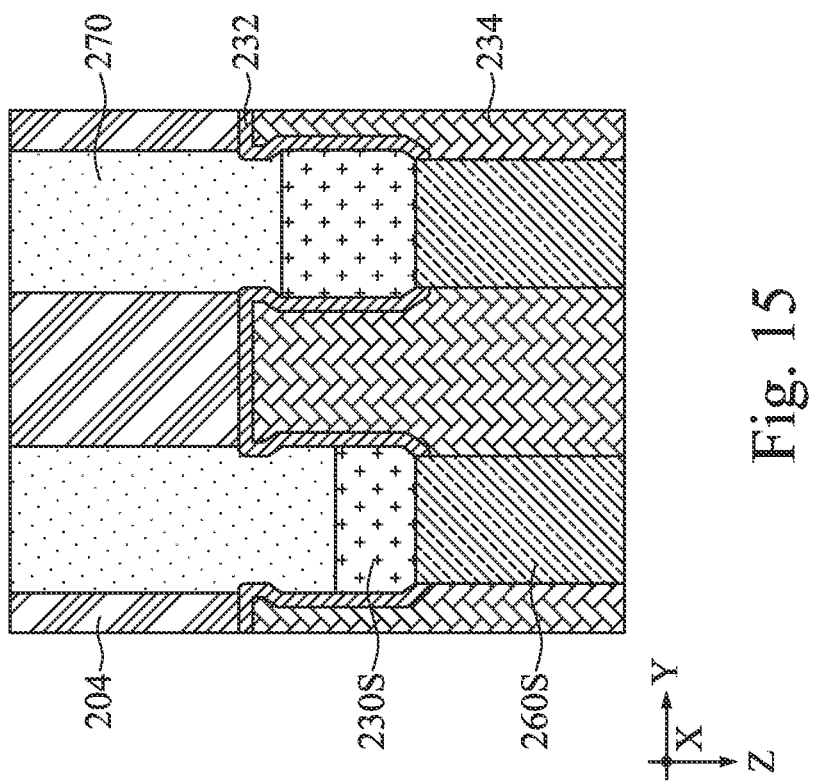

Referring to FIGS. 1 and 4A-4E, method 100 includes a block 106 where the first base portion 202-1 and the second base portion 202-2 are selectively etched to form trenches 268 exposing the backside of the joint gate structure 250 (e.g., the interfacial layer 252). The trenches 268 also expose surfaces of the source/drain features 230. In some embodiments, operations at block 106 applies an etching process that is tuned to be selective to the materials of the semiconductor material (e.g. silicon) in the base portions 202-1/202-2 and with no (or minimal) etching to the joint gate structure 250 (e.g., the interfacial layer 252), the isolation feature 204, the CESL 232, and the inner spacer features 228. In the illustrated embodiment, the etching process also etches the source/drain features 230 to recess them to a level that is even with the bottommost surface of the channel member 208. Yet, the channel members 208 remain unexposed in the trenches 268. In furtherance of some embodiments, the recessed source/drain features 230 remain lower than an interface between the isolation features 204 and the CESL 232 (as illustrated in FIG. 4D) and also lower than the bottommost inner spacer feature 228 (as illustrated in FIG. 4C). In some alternative embodiments, the recessed source/drain features 230 may remain above the bottommost surface of the channel member 208 (as illustrated in FIG. 13). In furtherance of the alternative embodiments, the recessed source/drain features 230 may remain above the bottommost inner spacer feature 228 and/or above the bottommost surface of the joint gate structure 250 (as illustrated in FIG. 14). In some other embodiments, due to the dopant difference (e.g., n-type dopant and p-type dopant), n-type and p-type source/drain features 230 may have etching selectivity difference, causing uneven recessed surfaces between n-type and p-type source/drain features 230 (as illustrated in FIG. 15). Operations at block 106 may apply more than one etching processes. For example, it may apply a first etching process to selectively remove the base portions 202-1/202-2, and then apply a second etching process to selectively recess the source/drain features 230 to the desired level, where the first and the second etching processes use different etching parameters such as using different etchants. The etching process(es) can be dry etching, wet etching, reactive ion etching, or other etching methods.

Referring to FIGS. 1 and 5A-5E, method 100 includes a block 108 where a backside dielectric layer 270 with one or more dielectric materials is deposited to fill the trenches 268 and cover the exposed bottom surfaces of the joint gate structure 250 and the source/drain features 230. In some embodiments, the backside dielectric layer 270 may include one or more of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be formed by PE-CVD, F-CVD or other suitable methods. Further, in the present embodiment, the backside dielectric layer 270 and the isolation feature 204 may include different materials so that the isolation feature 204 may act as a CMP stop when the backside dielectric layer 270 is planarized by the CMP process to expose the isolation feature 204.

Referring to FIGS. 1, 6A-6E and 7A-7E, method 100 includes a block 110 where the isolation feature 204 is selectively etched to form a pilot opening 282 that exposes the joint gate structure 250. Operations at block 110 include formation of a patterned hard mask 280 (shown in FIGS. 6A-6E) and formation of a pilot opening 282 (shown in FIGS. 7A-7E). In an example process, a hard mask layer is blanketly deposited over the workpiece 200 using CVD. The hard mask layer may be a single layer or a multi-layer. When the hard mask layer is a multi-layer, the hard mask layer may include a silicon oxide layer and silicon nitride layer. After a deposition of the hard mask layer, photolithography and etch processes may be performed to pattern the hard mask layer to form the patterned hard mask. In some instances, a photoresist layer is deposited over the hard mask layer. To pattern the photoresist layer, the photoresist layer is exposed to radiation reflected from or transmitting through a photomask, baked in a post-exposure bake process, and developed in a developer. The patterned photoresist layer is then applied as an etch mask to etch the hard mask layer, thereby forming the patterned hard mask 280. Referring to FIGS. 6A-6E, the patterned hard mask 280 includes a mask opening 281 that is substantially aligned with the to-be-formed pilot opening 282. According to the present disclosure, the patterned hard mask 280 functions to mask portions of the isolation feature 204 that are not to be etched. It does not matter if a portion of the backside dielectric layer 270 is exposed in the mask opening 281. As shown by the dotted lines in FIG. 6E, the mask opening 281 may not be coterminous with portions of the backside dielectric layer 270. This is so because the etch process in forming the pilot opening 282 is selective to the isolation feature 204 and does not substantially etch the backside dielectric layer 270. Similarly, as shown by the dotted lines in FIG. 6B, even when the mask opening 281 is larger than the width of the joint gate structure 250 or is misaligned, the pilot opening 282 may still be successfully formed. Notably, in the illustrated embodiment, each of the source feature 230S and the drain feature 230D has no backside conductive features landing thereon, such as backside source/drain contacts and/or backside power rails, therefore there is no concern that the mask opening 281 may expose such conductive features and cause etching damage during subsequent etching processes. Accordingly, backside etching fidelity can be enhanced.

Figure 7A:
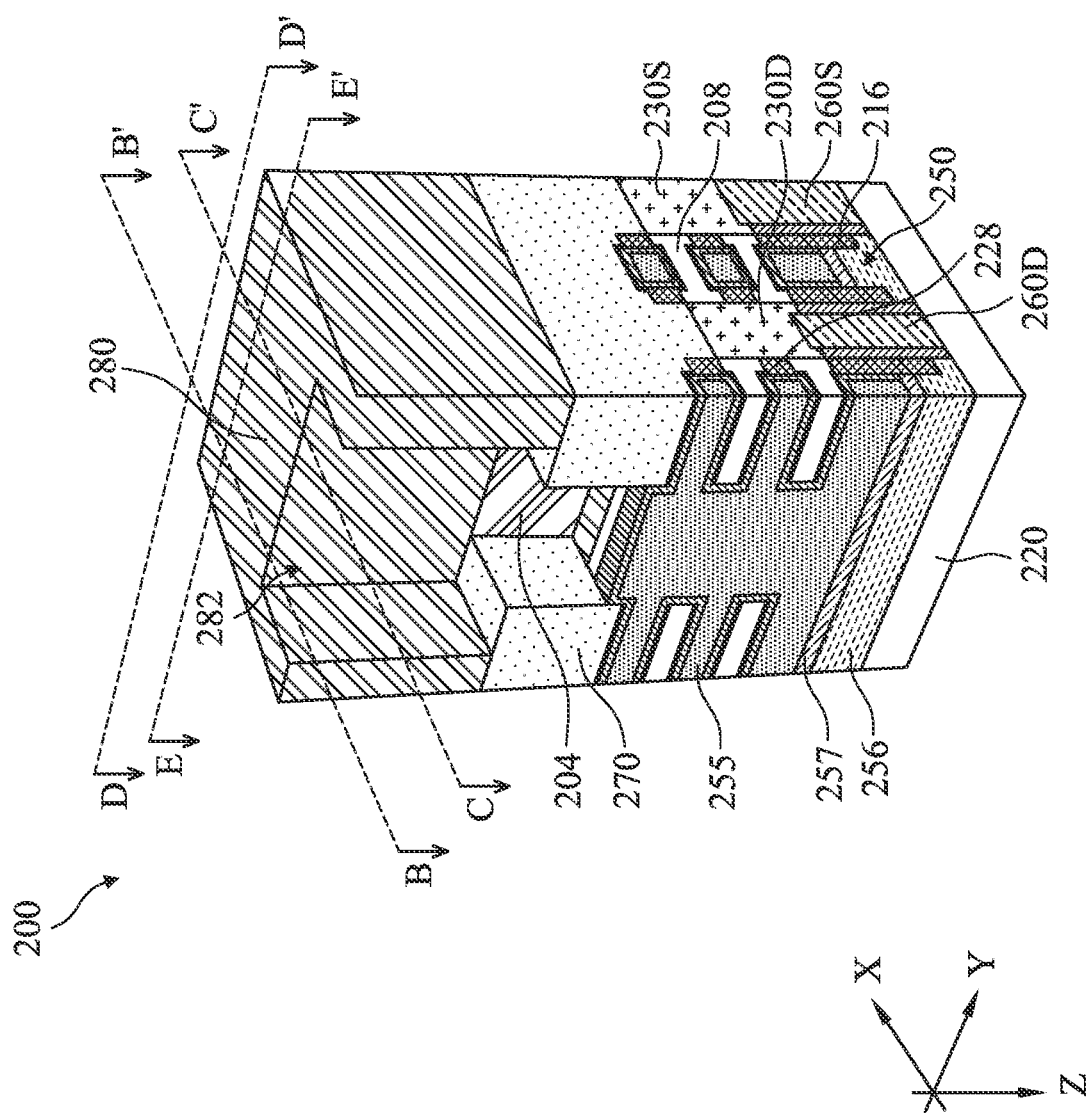
Figure 7C:
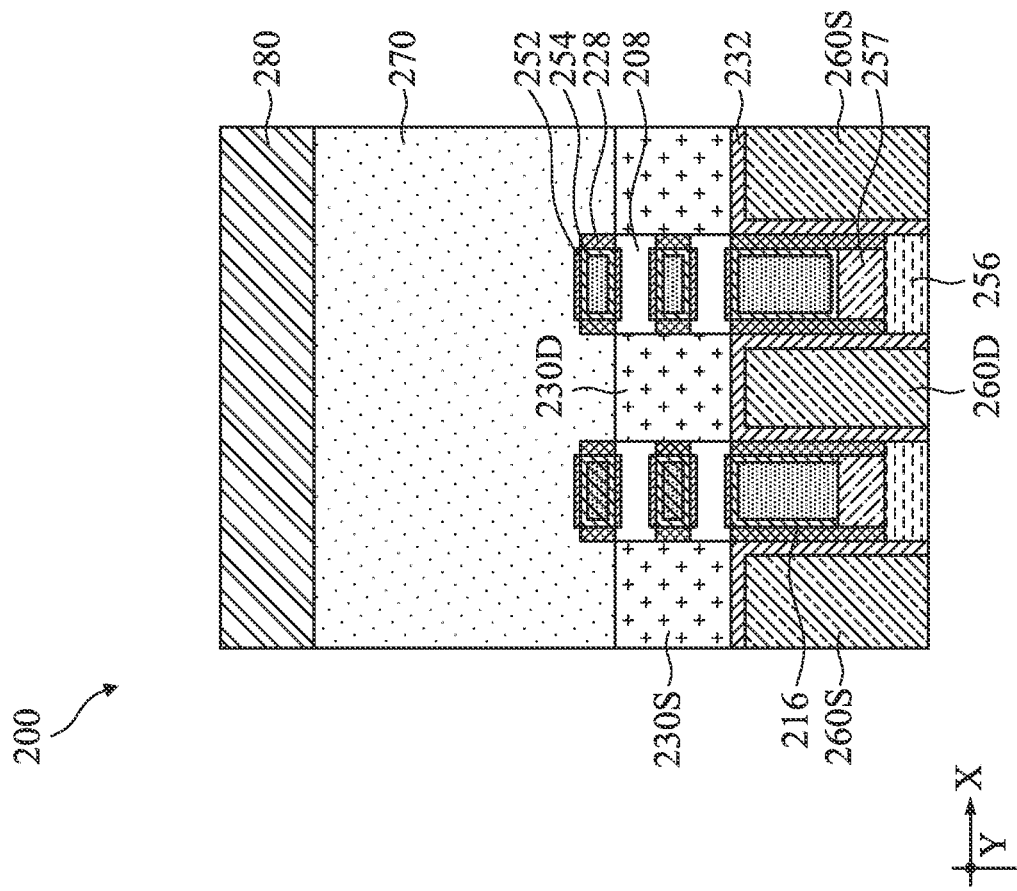
Figure 7B:
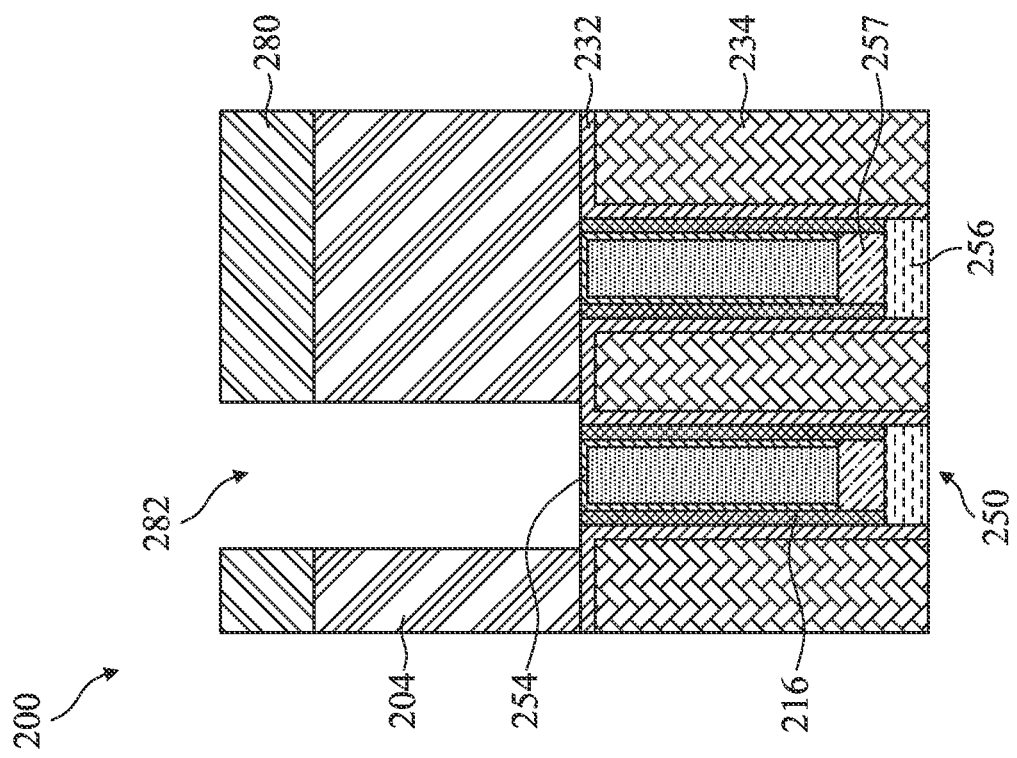
Figure 7D:
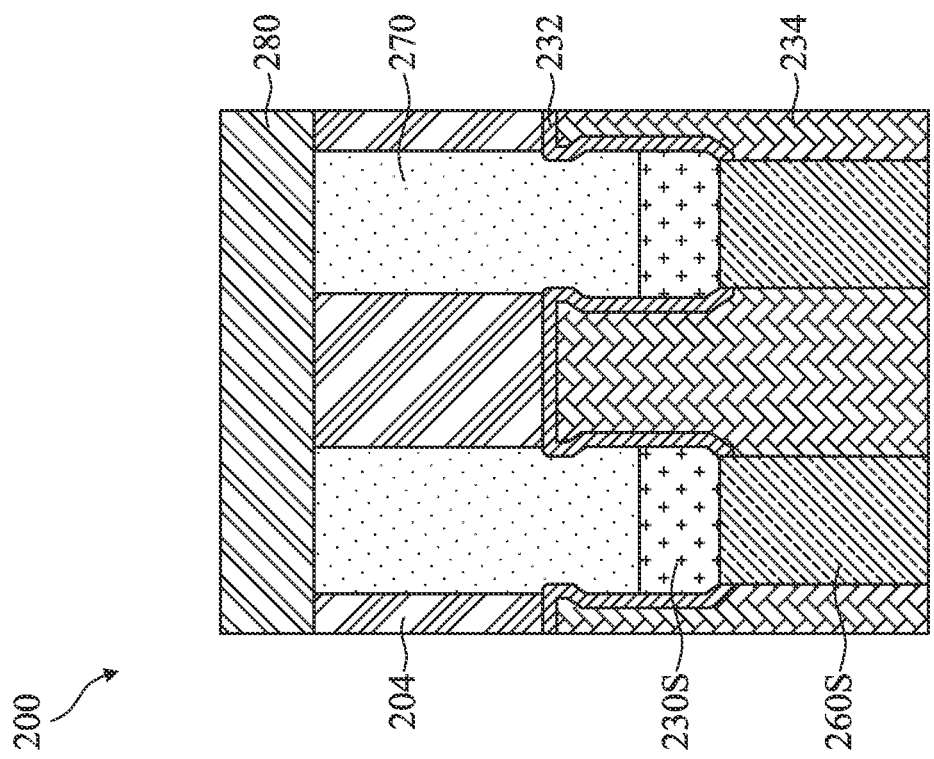
Figure 7E:
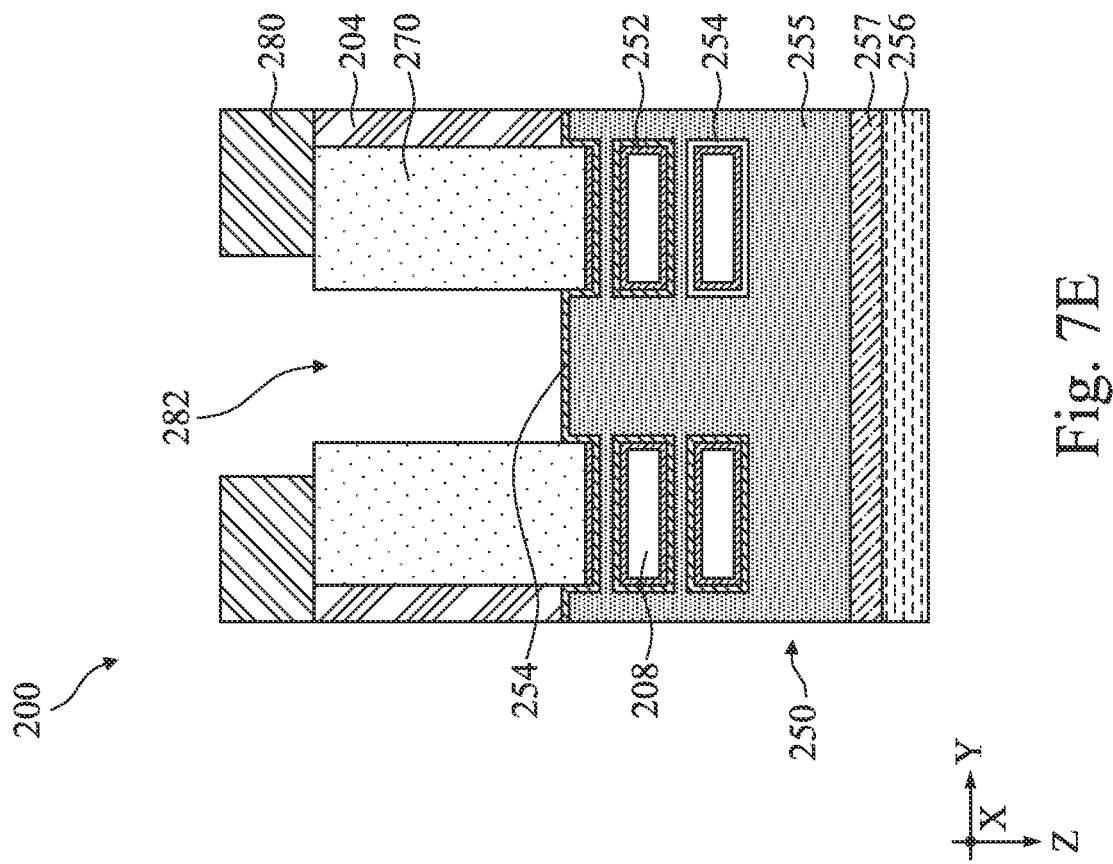

Reference is then made to FIGS. 7B and 7E. With the patterned hard mask 280 in place, the isolation feature 204 is selectively and anisotropically etched to form the pilot opening 282. In some embodiments, the isolation feature 204 may be etched using a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. As shown in FIG. 7B, the pilot opening 282 may terminate on top-facing surfaces of the gate dielectric layer 254, the gate spacer 216, and the CESL 232, without extending into the gate electrode layer 255 of the joint gate structure 250. As shown in FIG. 7B, because the mask opening 281 is not coterminous with the backside dielectric layer 270, a width of the pilot opening 282 is smaller than a width of the mask opening 281 along the Y direction.

Figure 8A:
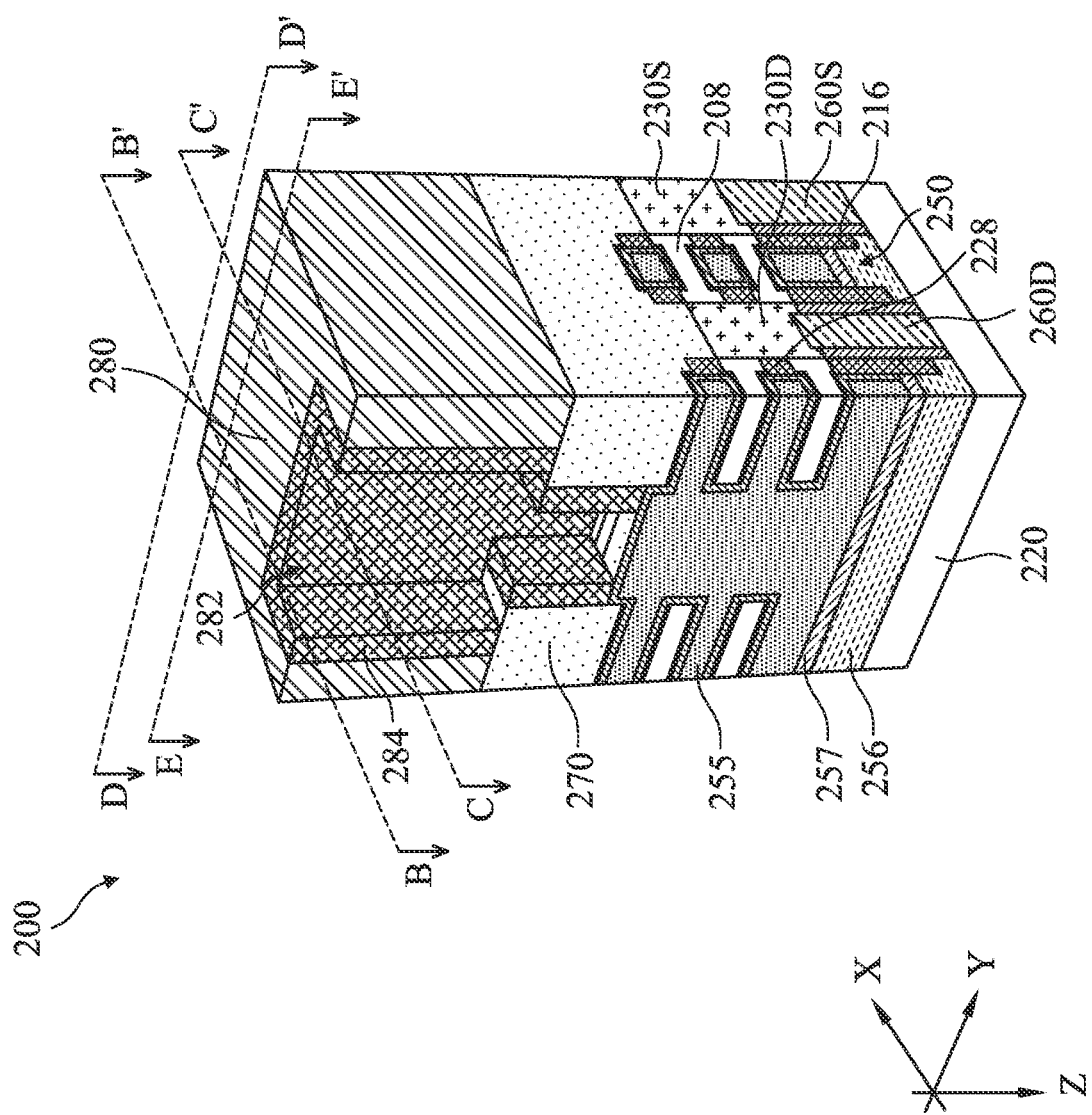
Figure 8C:
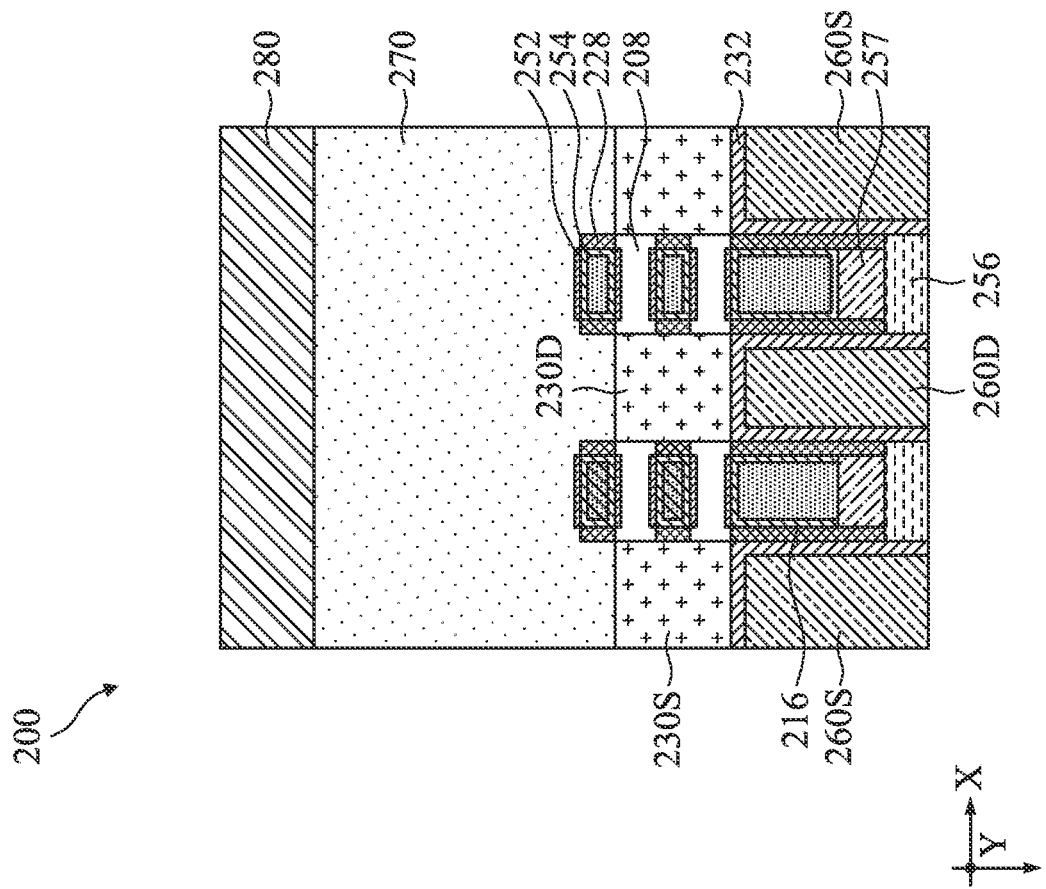
Figure 8B:
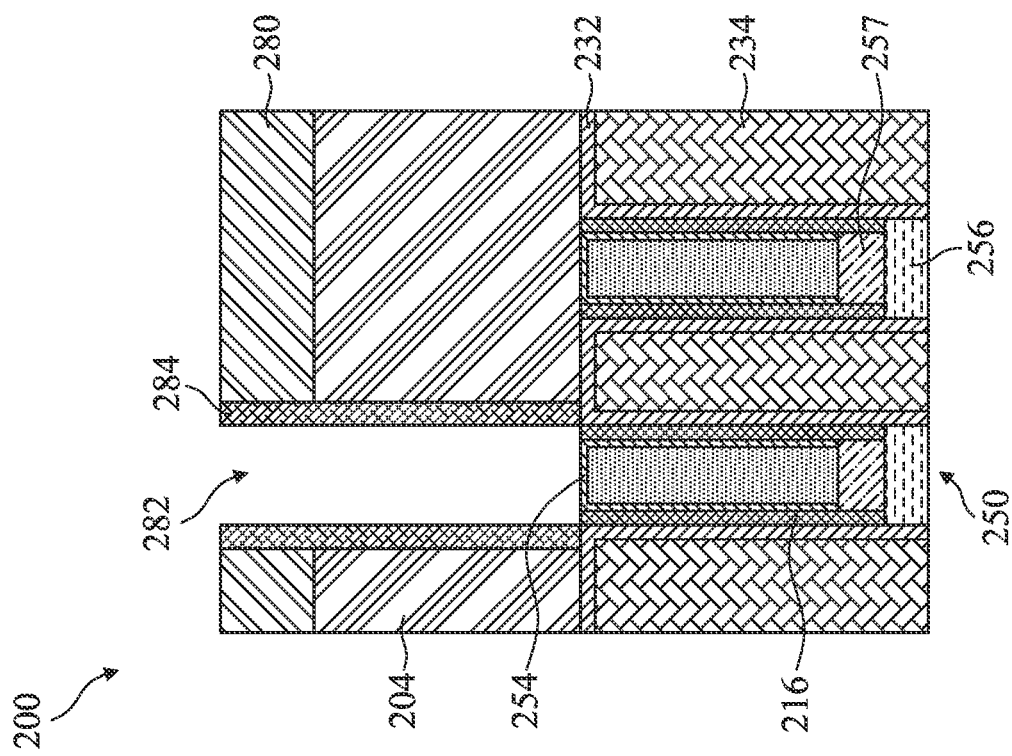

Referring to FIGS. 1 and 8A-8E, method 100 includes a block 112 where a liner 284 is deposited along sidewalls of the pilot opening 282 and reduces the size of the pilot opening 282. The liner 284 defines a distance between the to-be-formed gate cut feature and the channel member 208. The liner 284 may also be referred to as a cut metal gate end cap layer. The liner 284 also functions to protect the backside dielectric layer 270 from the etch process at block 114. The liner 284 may be a single layer or a multi-layer. In an example process, at least one dielectric material is deposited over the backside of the workpiece 200 and then the deposited dielectric material is anisotropically etched back to expose the gate dielectric layer 254, as shown in FIGS. 8A, 8B, and 8E. In some instances, the at least one dielectric material for the liner 284 may include silicon, oxygen, nitrogen, or carbon. For example, the at least one dielectric material may include silicon nitride, silicon carbonitride, silicon oxycarbonitride, silicon oxycarbide, or silicon oxynitride. After the etch back process, the liner 284 may have a thickness between about 6 nm and about 10 nm.

Figure 9A:
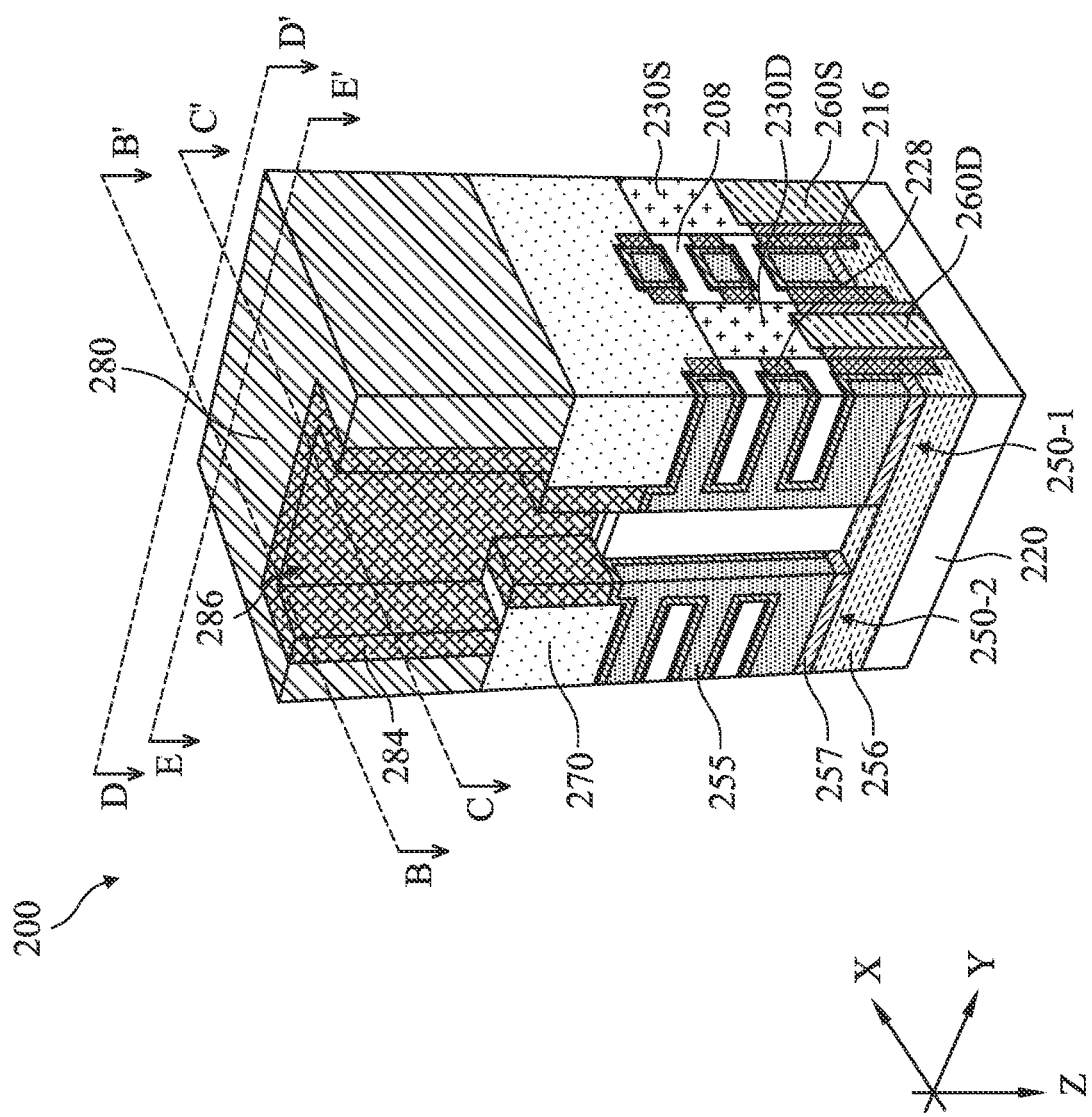
Figure 9C:
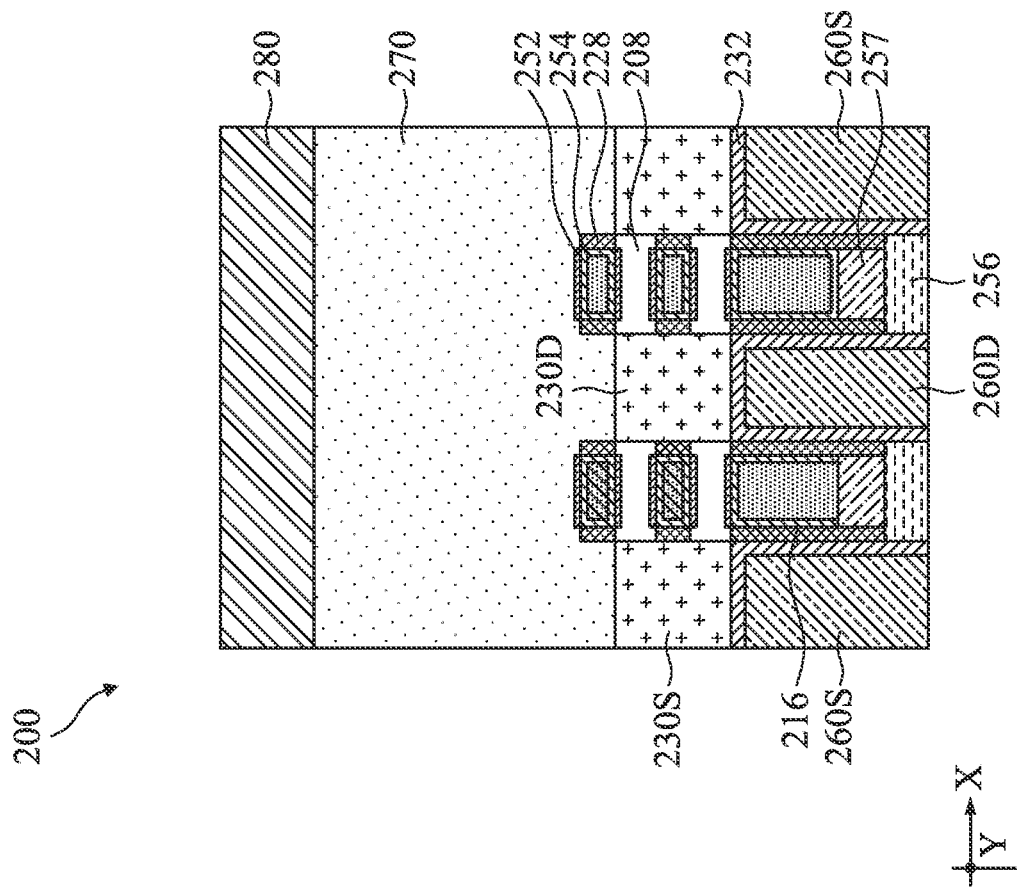
Figure 9B:
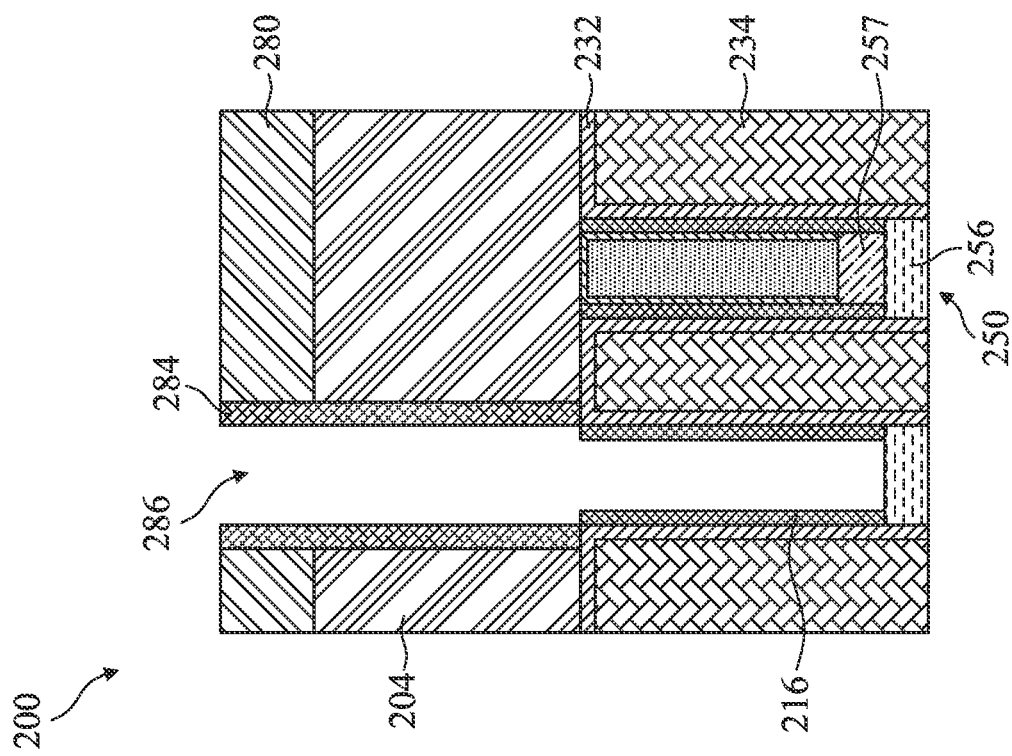
Figure 9E:
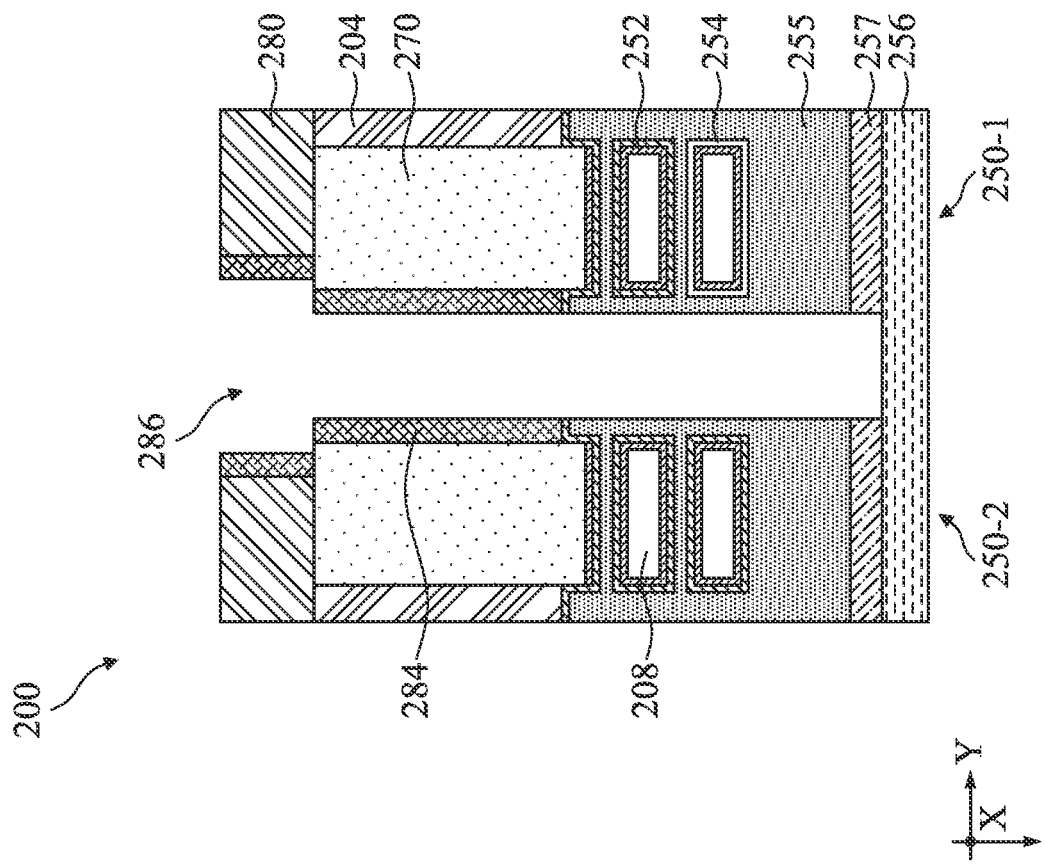
Figure 9D:
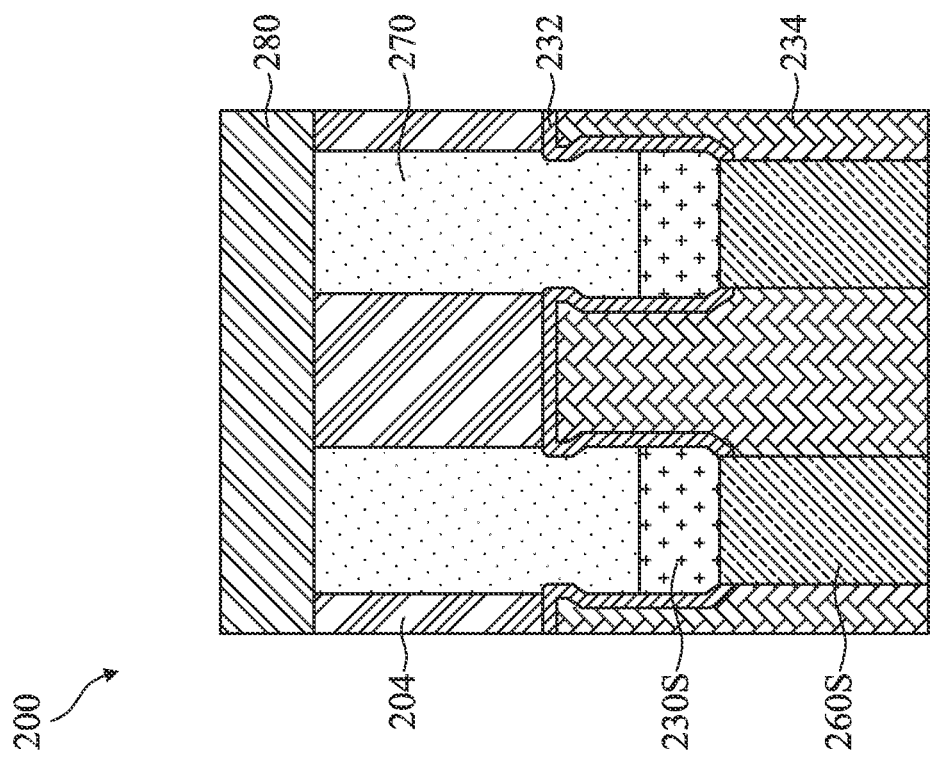

Referring to FIGS. 1 and 9A-9E, method 100 includes a block 114 where the pilot opening 282 is extended through the joint gate structure 250 to form a gate cut opening 286. At block 114, an anisotropic etch process is performed to extend the pilot opening 282 to form the gate cut opening 286. In some embodiments, the gate cut opening 286 terminates on or in the gate SAC dielectric layer 256. As shown in FIGS. 9A, 9B and 9E, because the anisotropic etch process etches the liner 284, the gate spacer 216, and the gate SAC dielectric layer 256 at a slower rate, these structures confine the etch process at block 114 and define the boundaries of the gate cut opening 286. In some implementations, the anisotropic etch process at block 114 may be a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. As shown in FIGS. 9A and 9E, the gate cut opening 286 separate the joint gate structure 250 into a first gate segment 250-1 and a second gate segment 250-2. Operations at block 114 may apply more than one etching processes. For example, it may apply a first etching process to selectively remove the joint gate structure 250 with the gate capping layer 257 as an etch stop layer, and then apply a second etching process to selectively remove the gate capping layer 257 with the gate SAC dielectric layer 256 as an etch stop layer, where the first and the second etching processes use different etching parameters such as using different etchants. Referring to FIG. 9B, in the illustrated embodiment, operations at block 114 expose the gate spacer 216 in the lower portion of the gate cut opening 286. Alternatively, the gate spacer 216 may be further removed in a selective etching process, such that the CESL 232 may be exposed in the gate cut opening 286. In yet another embodiment, the CESL 232 may be further removed in a selective etching process, such that the ILD layer 234 is exposed in the gate cut opening 286. One benefit of removing the gate spacer 216 and/or the CESL 232 is that the lower portion of the gate cut opening 286 can be expanded along the X direction, allowing a larger volume of air gap(s) 290 (FIGS. 10B and 10E) to be formed in the gate cut opening 286 which in turn further improves isolation between gate segments.

Referring to FIGS. 1 and 10A-10E, method 100 includes a block 116 where a dielectric material is deposited in the gate cut opening 286 to form a gate cut feature 288. In some embodiments, the gate cut feature 288 is formed of a low-k dielectric material to reduce parasitic capacitance. The dielectric material for the gate cut feature 288 may be deposited using plasma-enhanced CVD (PECVD), high-density-plasma CVD (HDPCVD), or CVD. In some instances, the dielectric material for the gate cut feature 288 may include silicon nitride, silicon carbonitride, silicon oxycarbonitride, silicon oxycarbide, or silicon oxynitride. The gate cut feature 288 may be a single layer or a multilayer. When the gate cut feature 288 is a multilayer, the gate cut feature 288 may include a dielectric liner in contact with the gate segments and a dielectric filler spaced apart from the gate segments by the dielectric liner. The dielectric liner and the dielectric filler may be formed of different materials. For example, the dielectric liner is oxygen-free while the dielectric filler includes oxygen. For another example, the dielectric liner may have a dielectric constant greater than that of the dielectric filler. When the gate cut feature 288 is a multilayer, the dielectric liner may have a thickness between about 1 nm and about 6 nm. Operations at block 116 may include performing a planarization process, such as a CMP process, to the gate cut feature 288 to remove excessive dielectric materials from the backside of the workpiece 200 and expose the backside dielectric layer 270, the isolation feature 204, and the liner 284.

Still referring to FIGS. 10A-10E, in the illustrated embodiment, the dielectric material of the gate cut feature 288 also caps an air gap (or void) 290 in the gate cut opening 286. The deposition of the dielectric material of the gate cut feature 288 may also be referred to as a capping process. In an embodiment, the dielectric material of the gate cut feature 288 is deposited by a PECVD process, which is easier to have depositing dielectric materials merge on top of a narrow opening. The parameters in the PECVD process (e.g., pressure, temperature, and gas viscosity) are tuned in a way such that the gap fill behavior of depositing dielectric materials maintains the air gap 290 without entirely filling the gate cut opening 286. In the present embodiment, the PECVD process employs a setting with pressure less than about 0.75 torr and temperature higher than about 75° C. Hence, the dielectric material of the gate cut feature 288 may enclose the gate cut opening 286 without a significant amount being deposited in a lower portion of the gate cut opening 286 and keep the air gap 290. The air gap 290 may extend continuously from a channel region to abutting source/drain regions, providing isolation between adjacent gate segments 250-1/250-2 and also between adjacent source/drain features. A gas, such as a gas(es) used during the deposition of the dielectric material of the gate cut feature 288 or any other species that can diffuse into the air gap 290, may be in the air gap 290.

Figure 10A:
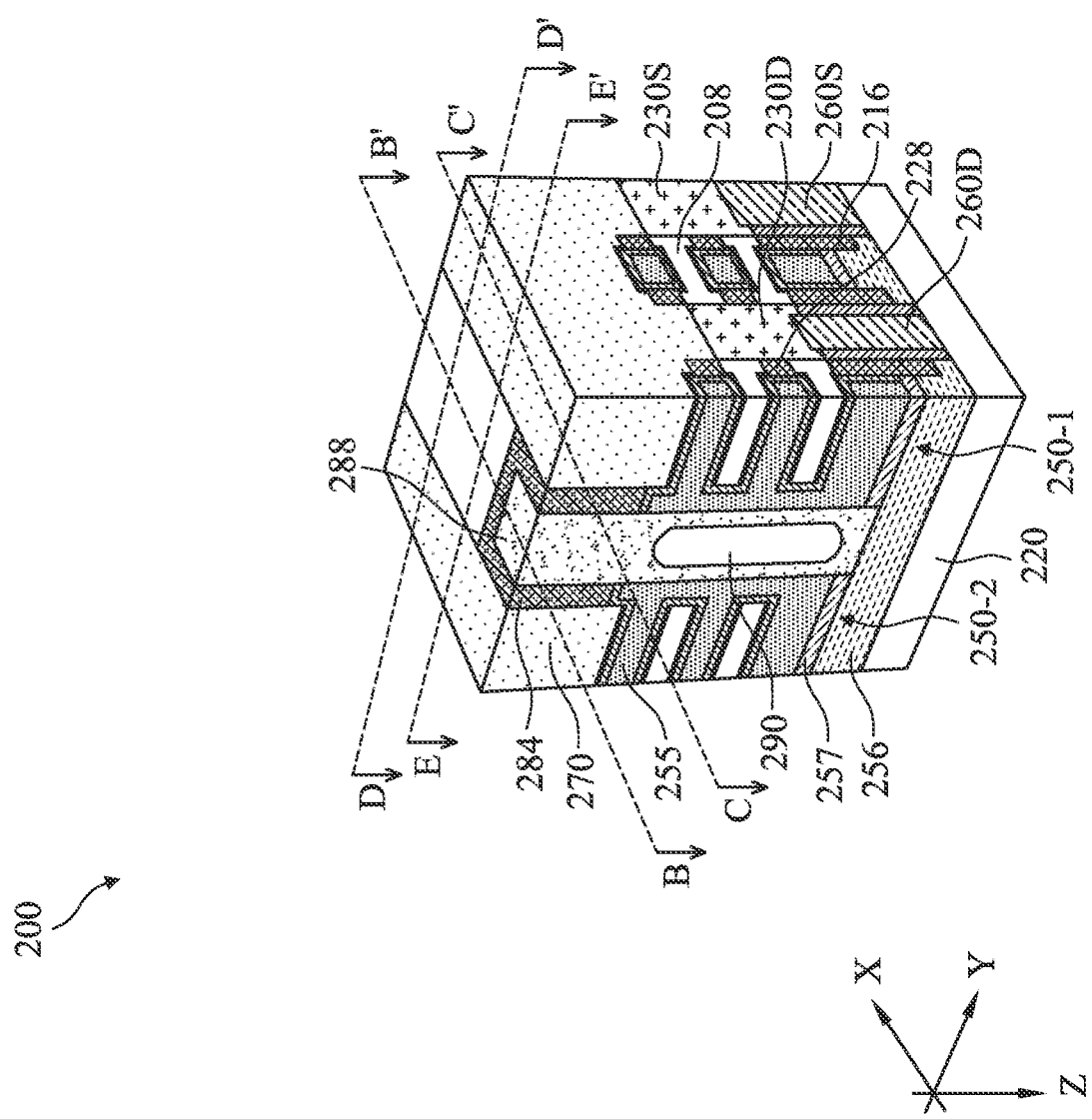
Figure 10C:
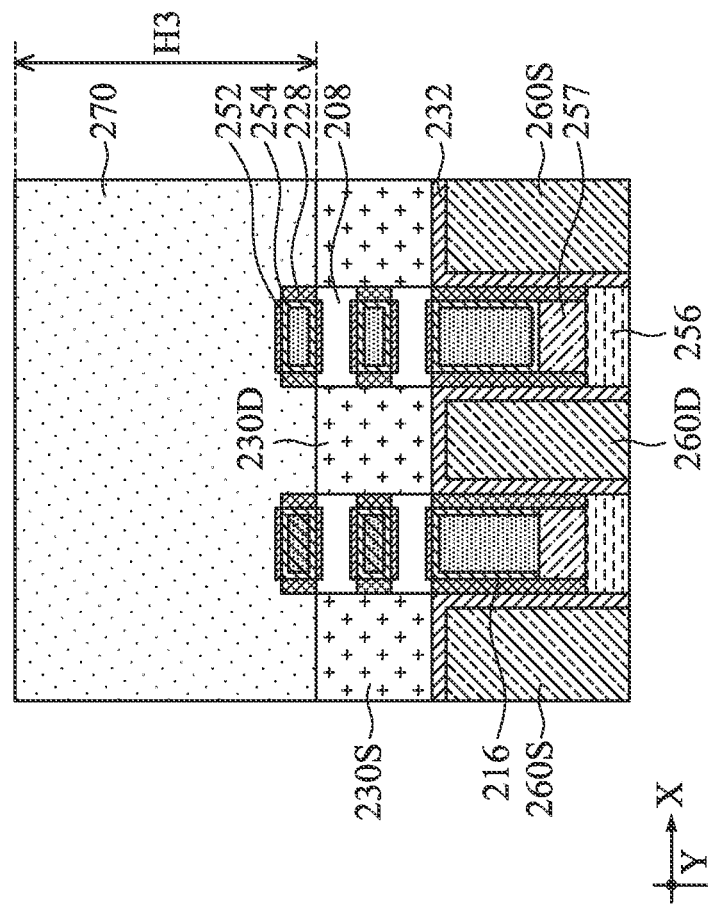
Figure 10B:
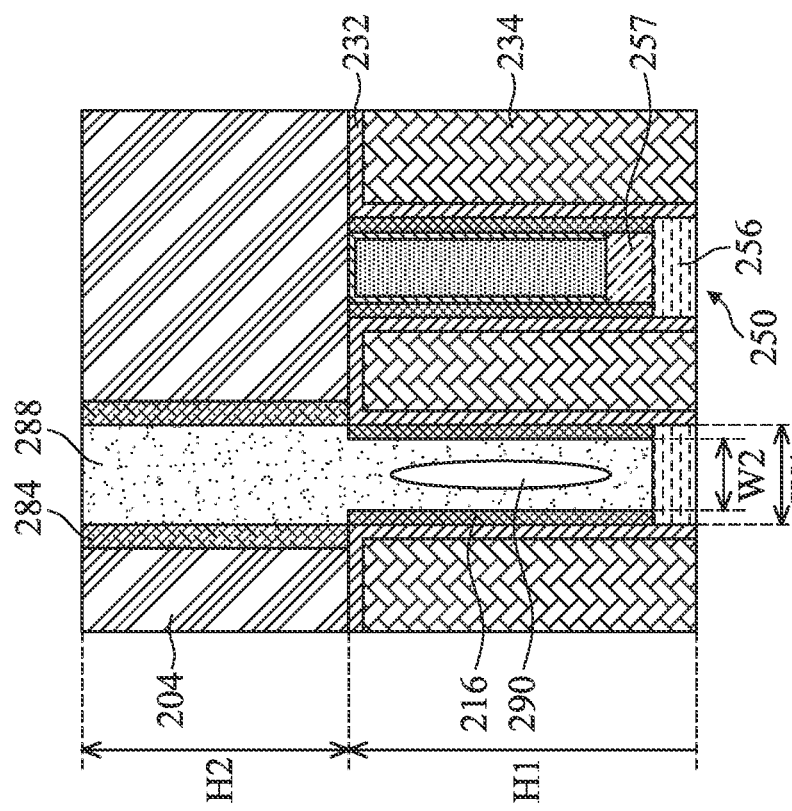
Figure 12:
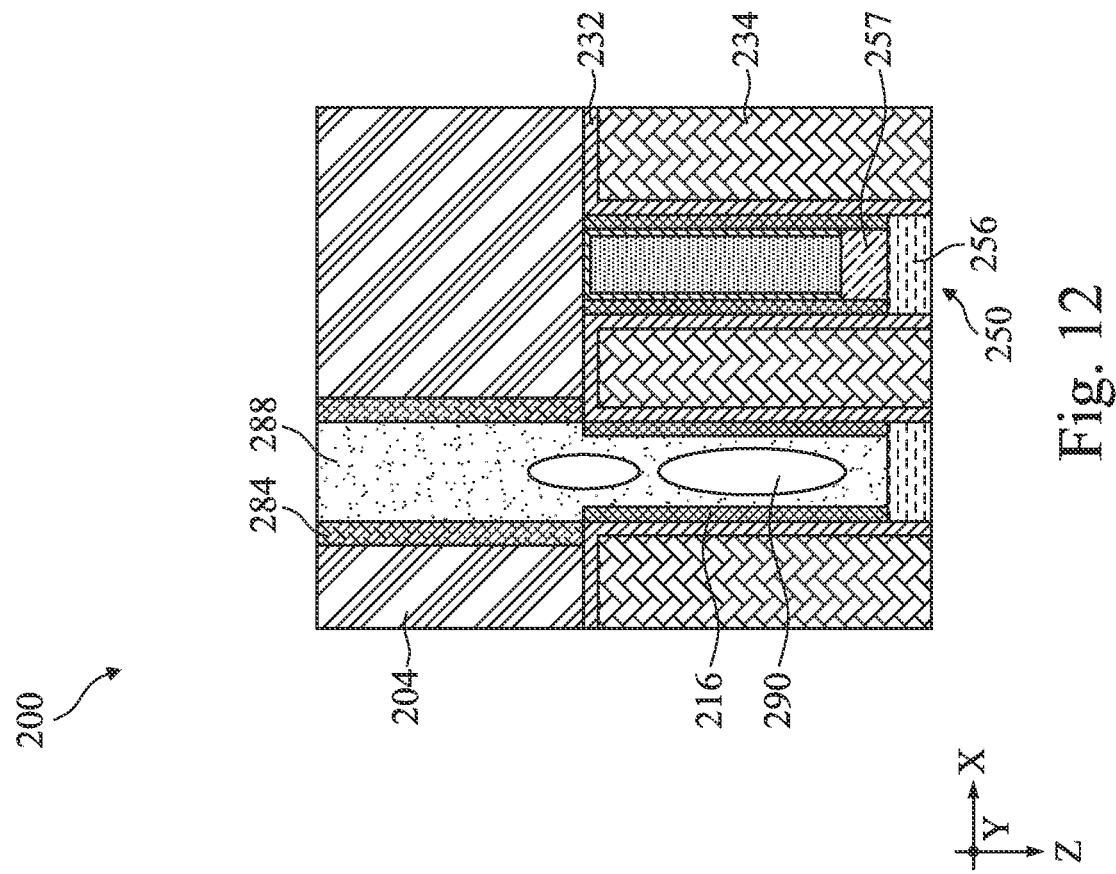
FIGS. 11, 12, 13, 14, 15, 16, 17, 18, 19, 20, 21, 22, and 23 illustrate alternative semiconductor structures or intermediate structures fabricated using the method of FIG. 1, according to one or more aspects of the present disclosure.
Figure 11:
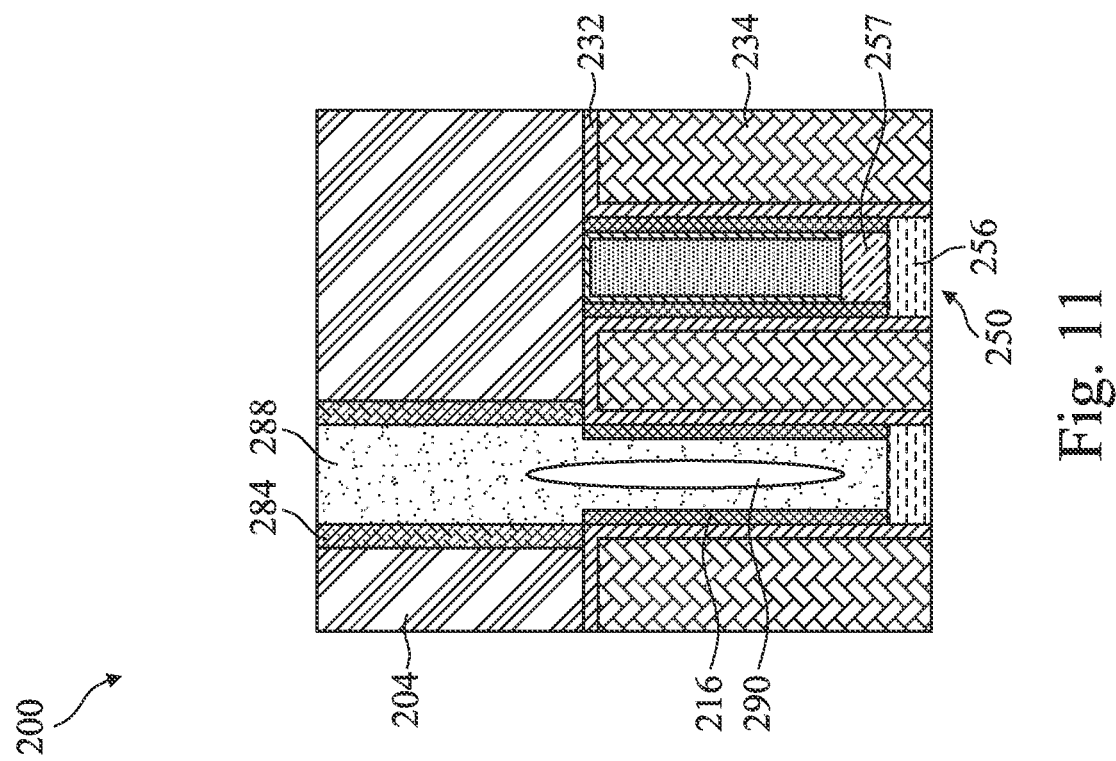

In one embodiment as shown in FIG. 10B, the air gap 290 stays below a bottom surface (defined as the surface proximal to the backside of the workpiece 200) of the ILD layer 234 (as well as below a bottom surface of the gate structure 250). In another embodiment as shown in FIG. 11, the air gap 290 may extend beyond the bottom surface of the ILD layer 234 (as well as beyond the bottom surface of the gate structure 250). Extending the air gap 290 beyond the bottom surfaces of the ILD layer 234 and the gate structure 250 helps improving the isolation between adjacent gate segments. In yet another embodiment as shown in FIG. 12, instead of an elongated continuous air gap, the capping process at block 116 may create a series of smaller air gaps 290 vertically stacked in the gate cut opening 286 along the Z direction. In some instances, the series of smaller air gaps 290 may vary in dimensions, such as a bottommost individual air gap 290 having a smaller height than others. The bottommost individual air gap 290 may extend beyond the bottom surfaces of the ILD layer 234 and the gate structure 250, which also improves isolation and reduces parasitic capacitance.

Figure 10E:
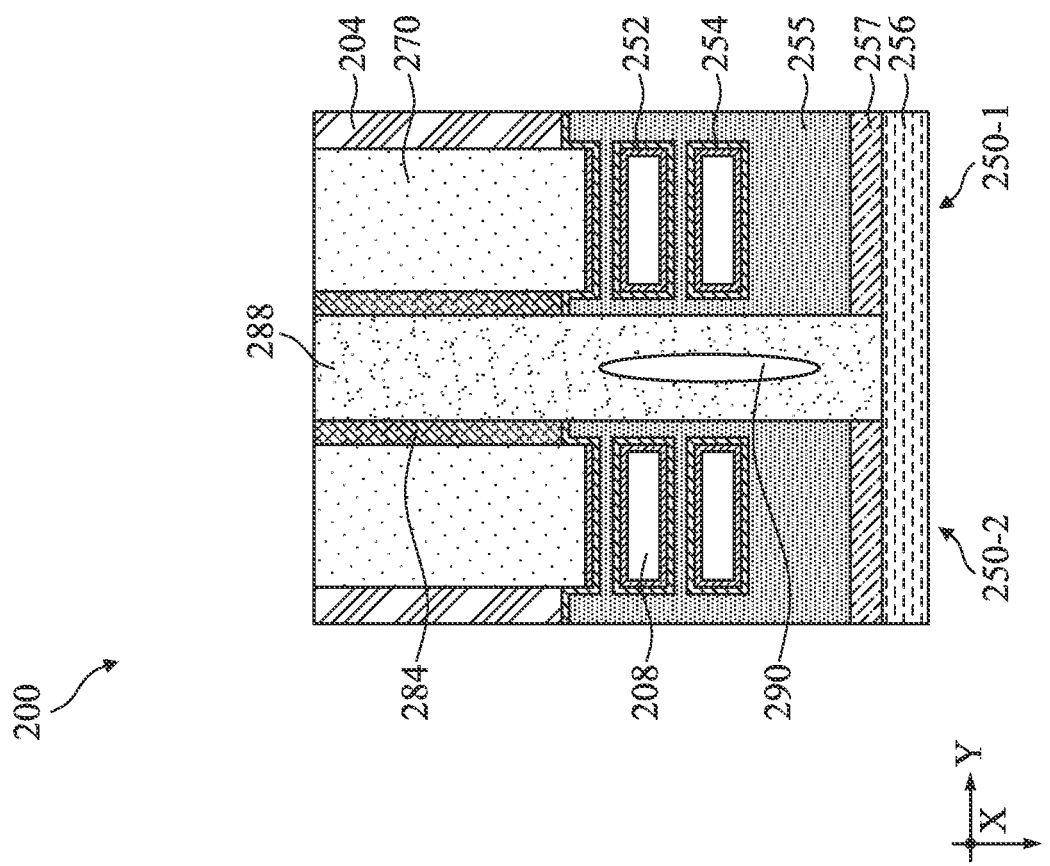
Figure 10D:
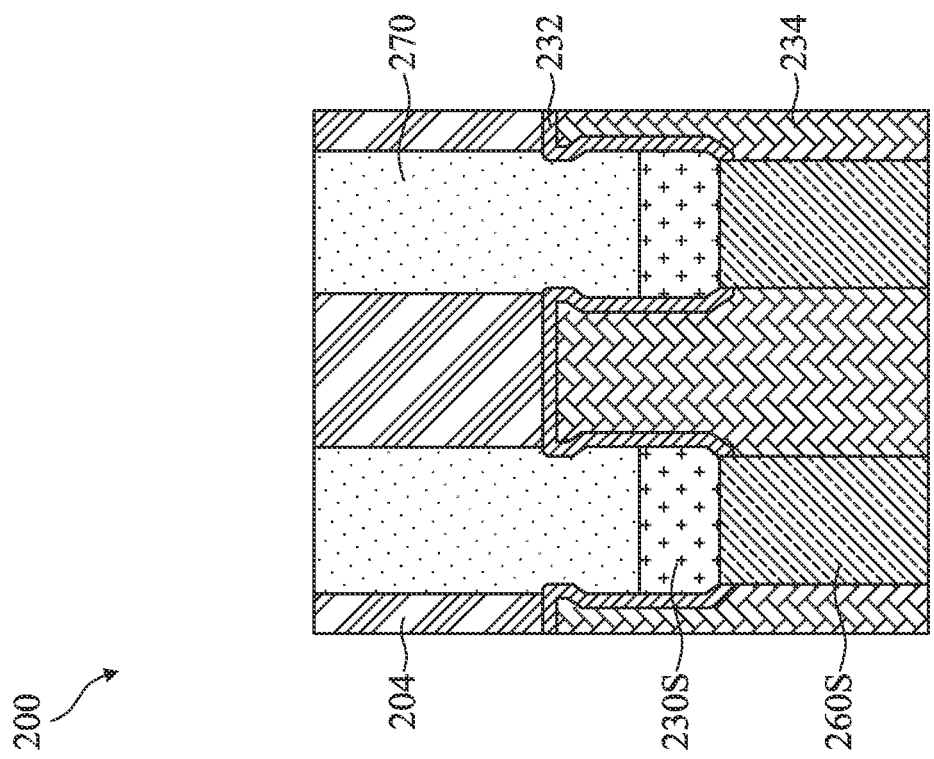

In FIG. 10B, the gate cut feature 288 includes a lower portion disposed between the gate spacers 216 and an upper portion disposed between the liners 284 along the X direction. Along the X direction, the lower portion includes a first width W1 and the upper portion includes a second width W2. In some instances, the first width W1 may be between about 6 nm and about 22 nm and the second width W2 may be between about 4 nm and about 22 nm. The lower portion includes a first height H1 and the upper portion includes a second height H2 along the Z direction. A sum of the first height H1 and the second height H2 may be between about 10 nm and about 80 nm. Referring to FIG. 10C, upon conclusion of the operations at block 116, the backside dielectric layer 270 may include a third height H3 between about 5 nm and about 20 nm. Such a low-profile backside dielectric layer 270 is mainly due to without a need to accommodate backside source/drain contacts, allowing a thickness reduction of about 10 nm to about 20 nm. Referring to FIG. 10E, along the Y direction, the lower portion of the gate cut feature is disposed between the gate electrode portions of the gate segments and the upper portion is disposed between the liners 284. The workpiece 200 in FIGS. 10A-10E is flipped up-side-down. When the workpiece 200 in FIGS. 10A-10E is flipped back to an upright position, the backside dielectric layer 270 would be at the bottom and the gate SAC dielectric layer 256 would be on the top.

Figure 17:
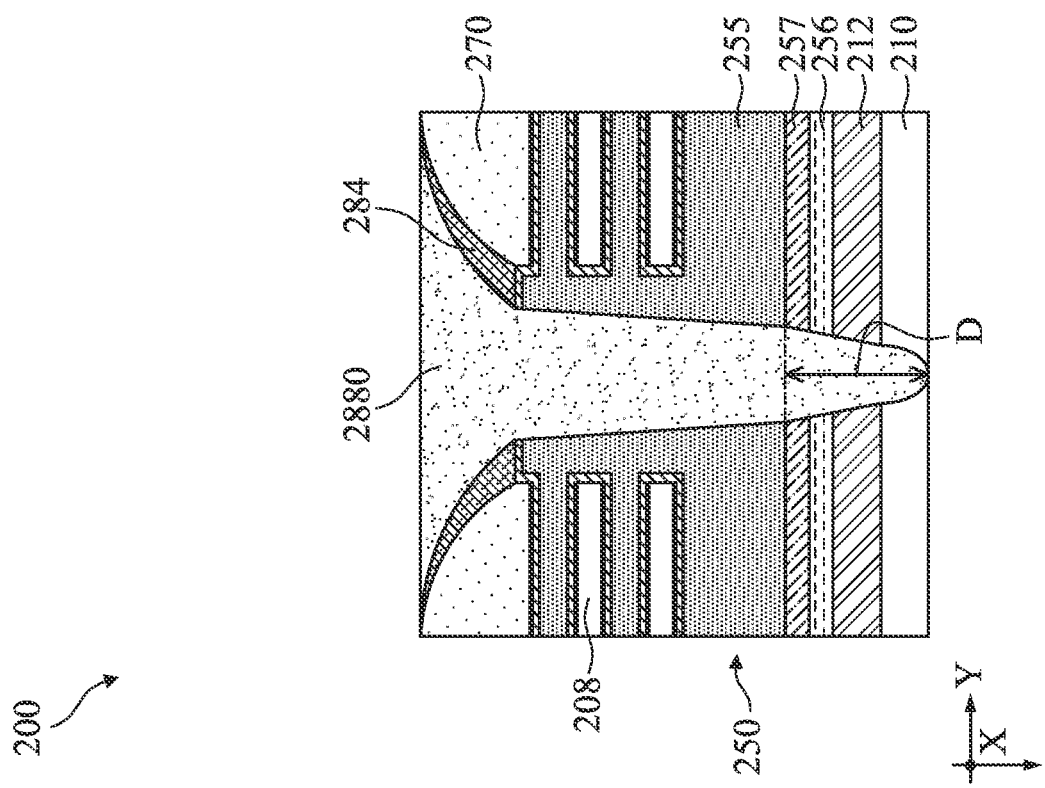
Figure 16:
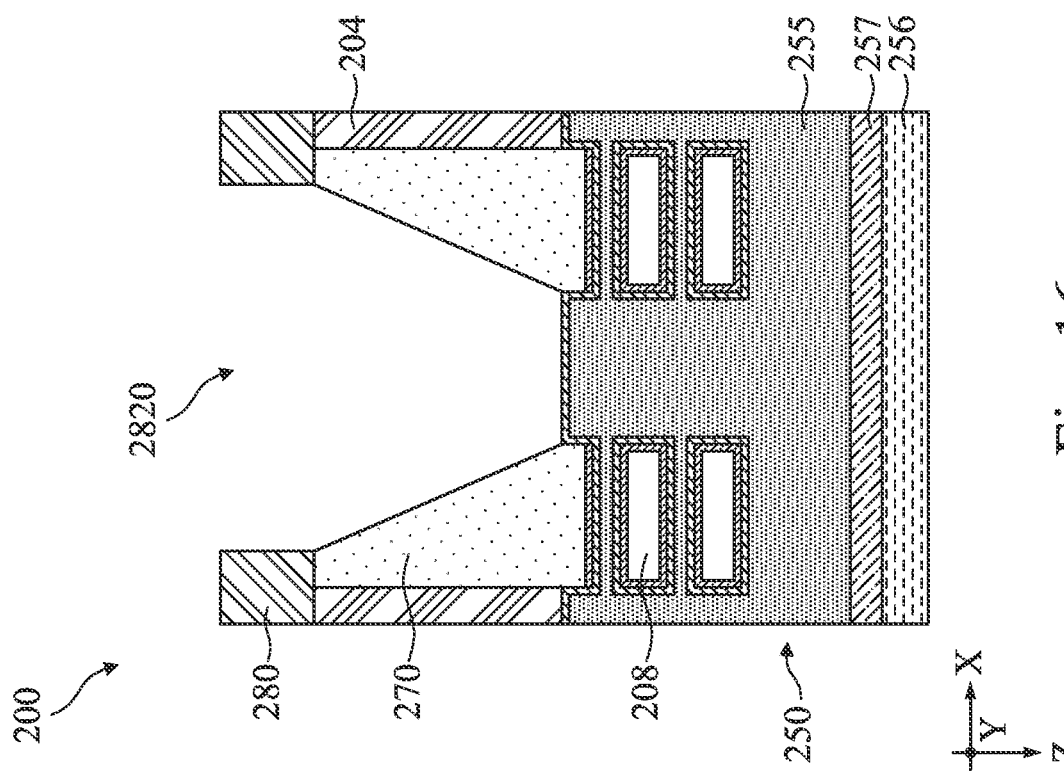

While FIGS. 7A, 7B and 7E illustrate that the pilot opening 282 includes substantially vertical sidewalls as result of the operations at block 110, pilot openings with tapered sidewalls are contemplated. Reference is made to FIG. 16. When the etch process at block 110 is not sufficiently anisotropic and selective, the backside dielectric layer 270 is also etched at block 110, resulting in a tapered pilot opening 2820. Referring to FIG. 17, the tapered pilot opening 2820 may have ripple effect to subsequent processes. As shown in FIG. 17, the liner 284 deposited in the tapered pilot opening 2820 and the tapered gate cut feature 2880 also inherit the tapered profile. The backside dielectric layer 270 may also include a wedge-like shape, when viewed along the X direction. FIG. 17 also illustrate an alternative embodiment where the gate cut opening or the tapered gate cut feature 2880 extends completely through the gate SAC dielectric layer 256. As shown in FIG. 17, the tapered gate cut feature 2880 may include a tapered tip portion that penetrates the gate SAC dielectric layer 256 into an etch stop layer (ESL) 212 and a top interlayer dielectric (ILD) layer 210. The ESL 212 and the top ILD layer 210 may be part of a frontside interconnect structure. The composition of the ESL 212 may be similar to the CESL 232 and the composition of the top ILD layer 210 may be similar to the ILD layer 234. As shown in FIG. 17, the tapered gate cut feature 2880 may have an over-etch depth D between about 3 nm and about 100 nm.

Figure 18:
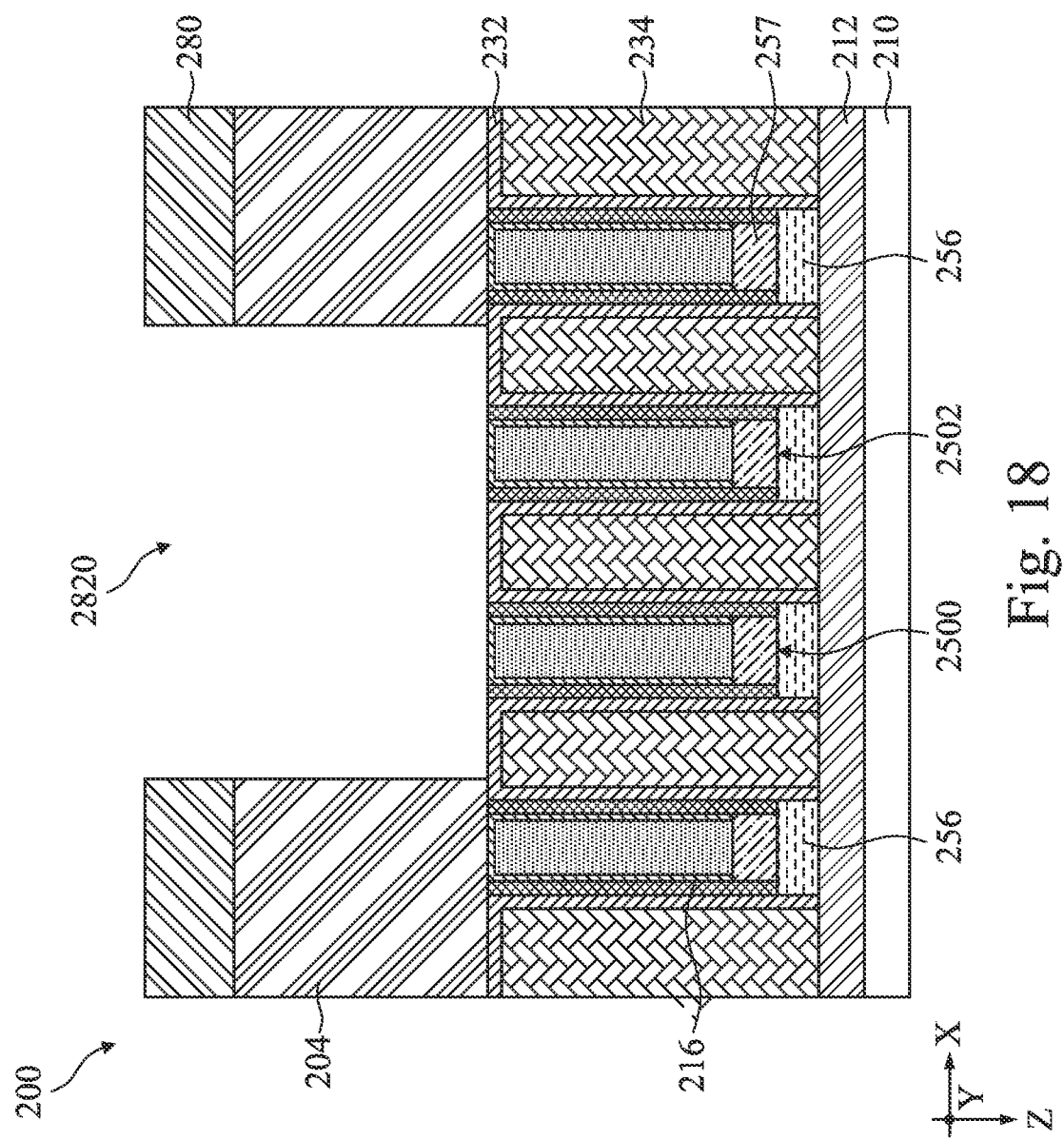
Figure 19:
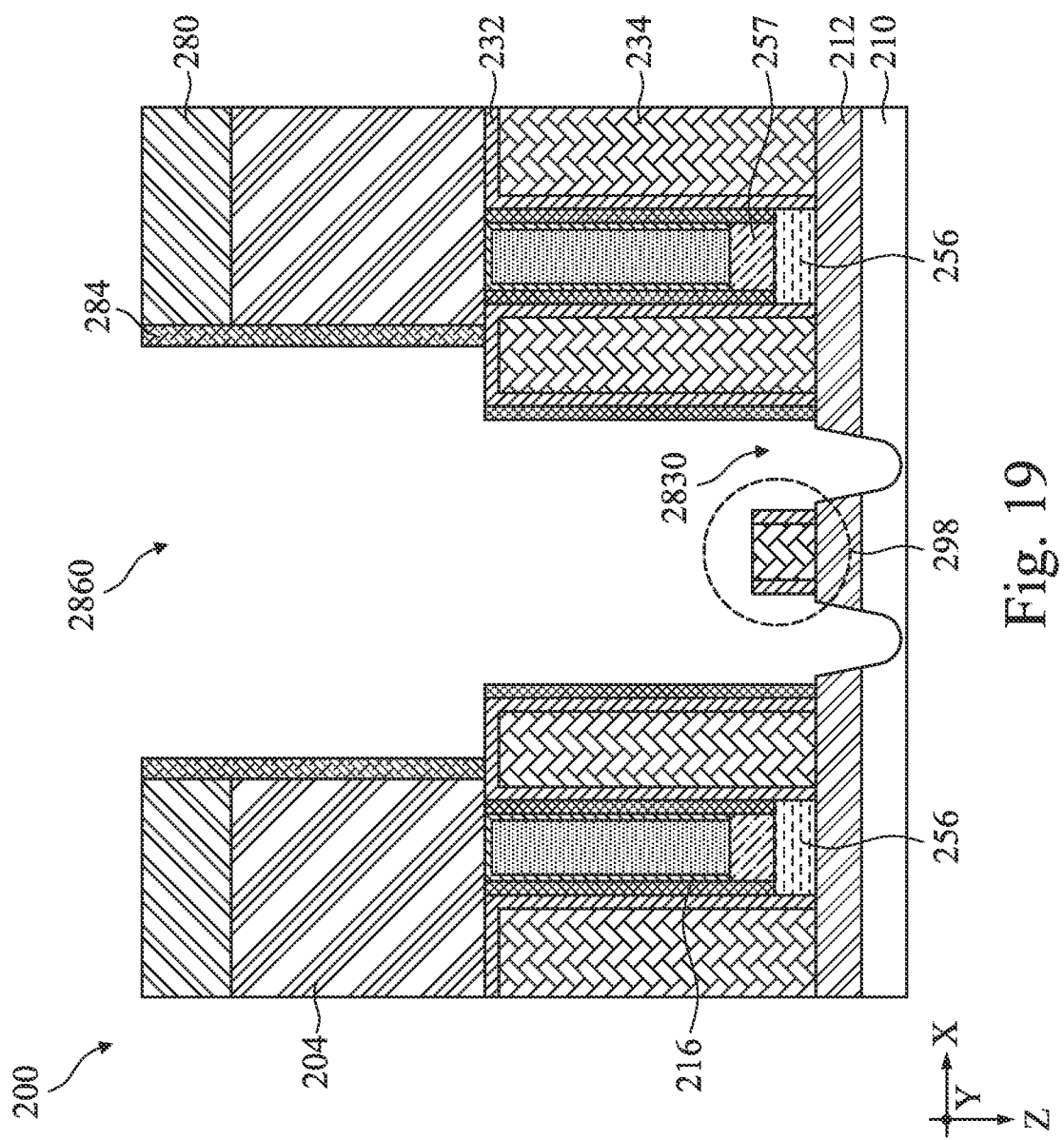
Figure 20:
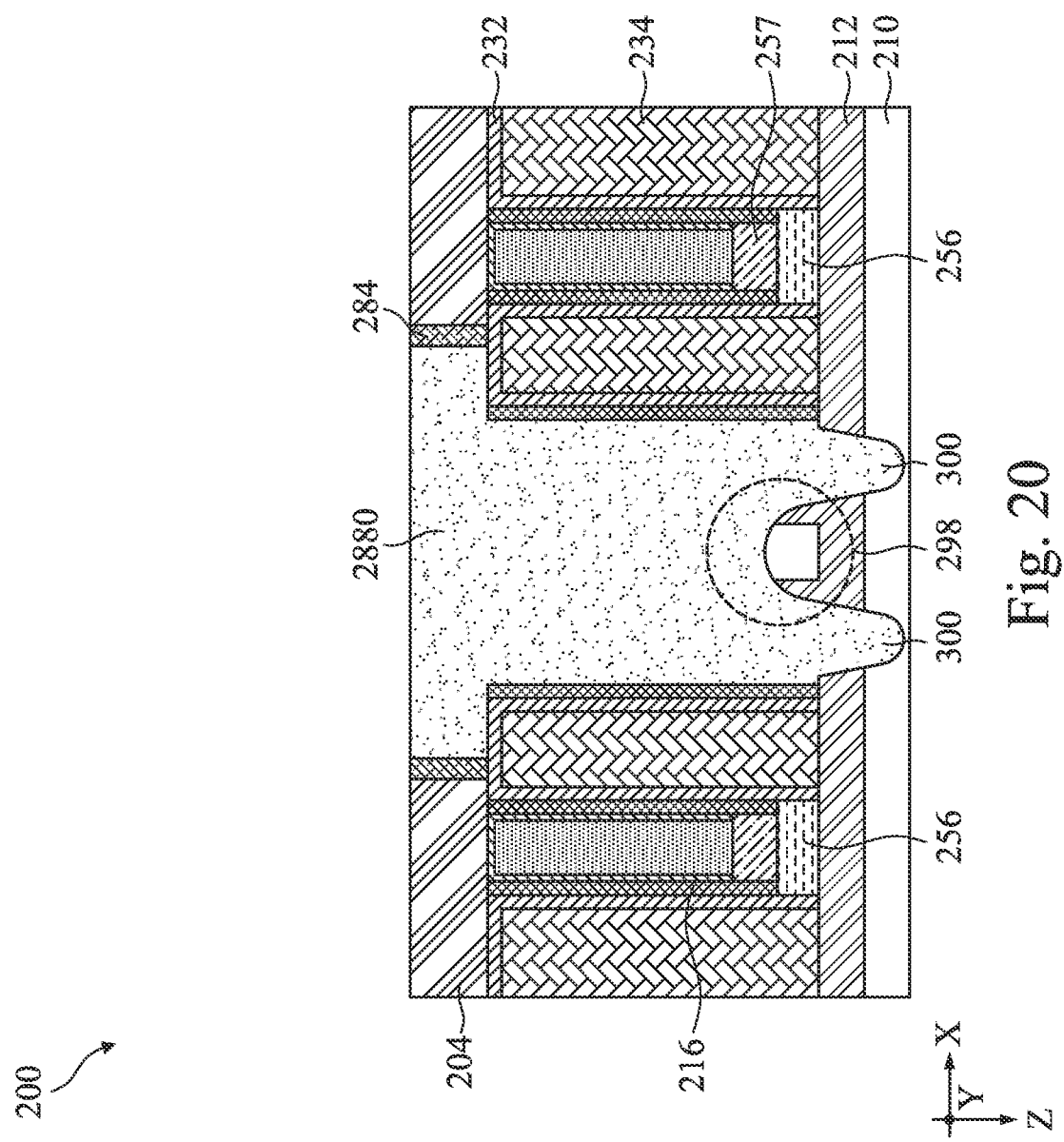

Gate cut features of the present disclosure may span across more than one joint gate structures. Referring to FIG. 18, a first slot pilot opening 2820 that spans across a first joint gate structure 2500 and a second joint gate structure 2502 may be formed at block 110 of method 100. Referring then to FIG. 19, after formation of the liner 284, the first slot pilot opening 2820 is extended downward through the first joint gate structure 2500 and the second joint gate structure 2502 to form a first slot gate cut opening 2860. The first slot gate cut opening 2860 not only separates the first joint gate structure 2500 into two gate segments but also separates the second joint gate structure 2502 into two gate segments. In some implementations represented in FIG. 19, the etch process to form the first slot gate cut opening 2860 may etch the joint gate structures faster than it does the CESL 232 and the ILD layer 234. As a result, a dielectric island 298 may be formed. FIG. 19 also illustrates that the first slot gate cut opening 2860 may include overshoot portions 2830 that extend through the ESL 212 and the top ILD layer 210 below the gate SAC dielectric layer 256. In these alternative embodiments, as shown in FIG. 20, operations at block 116 may form a first slot gate cut feature 2880 that generally tracks the shape of the first slot gate cut opening 2860. When viewed from the Y direction, the first slot gate cut feature 2880 includes leg portions 300 and straddles the dielectric island 298. The composition of the first slot gate cut feature 2880 may be similar to the gate cut feature 288 described above, which may further include air gap(s) 290 (not shown). The workpiece 200 in FIG. 20 is flipped up-side-down. When the workpiece 200 in FIG. 20 is flipped back to an upright position, the isolation feature 204 would be at the bottom and the two leg portions 300 would point upward.

Figure 21:
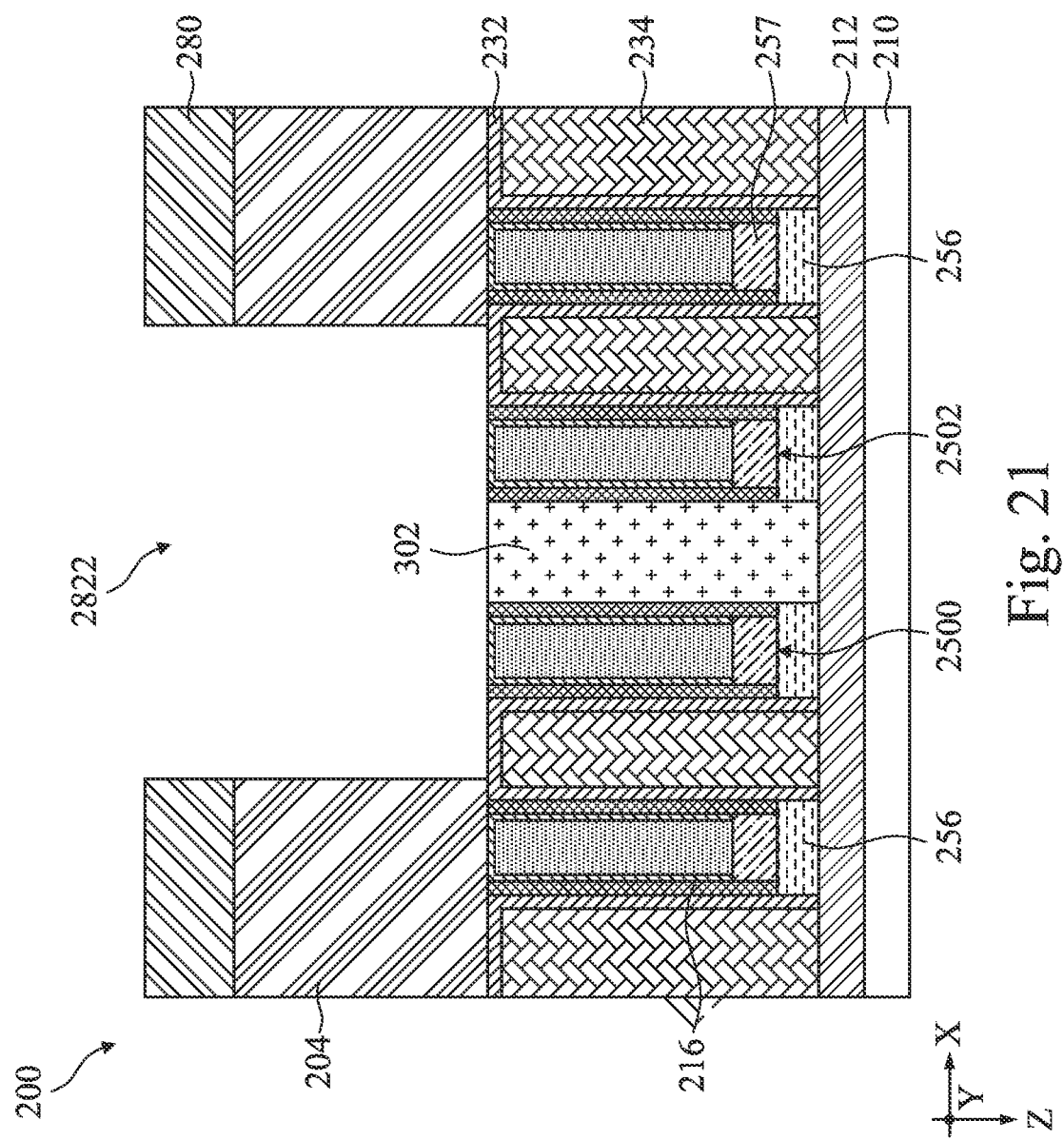
Figure 22:
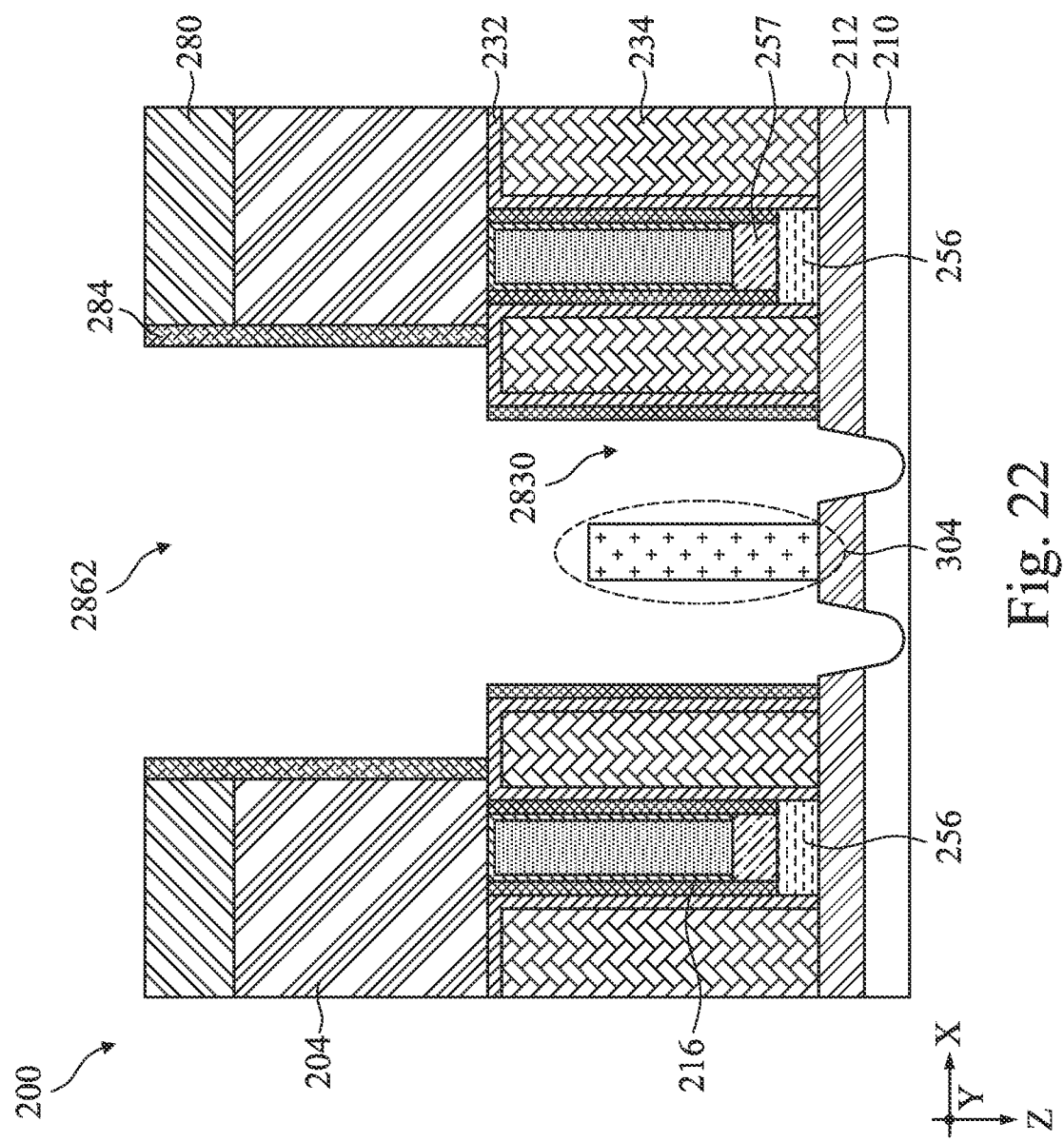
Figure 23:
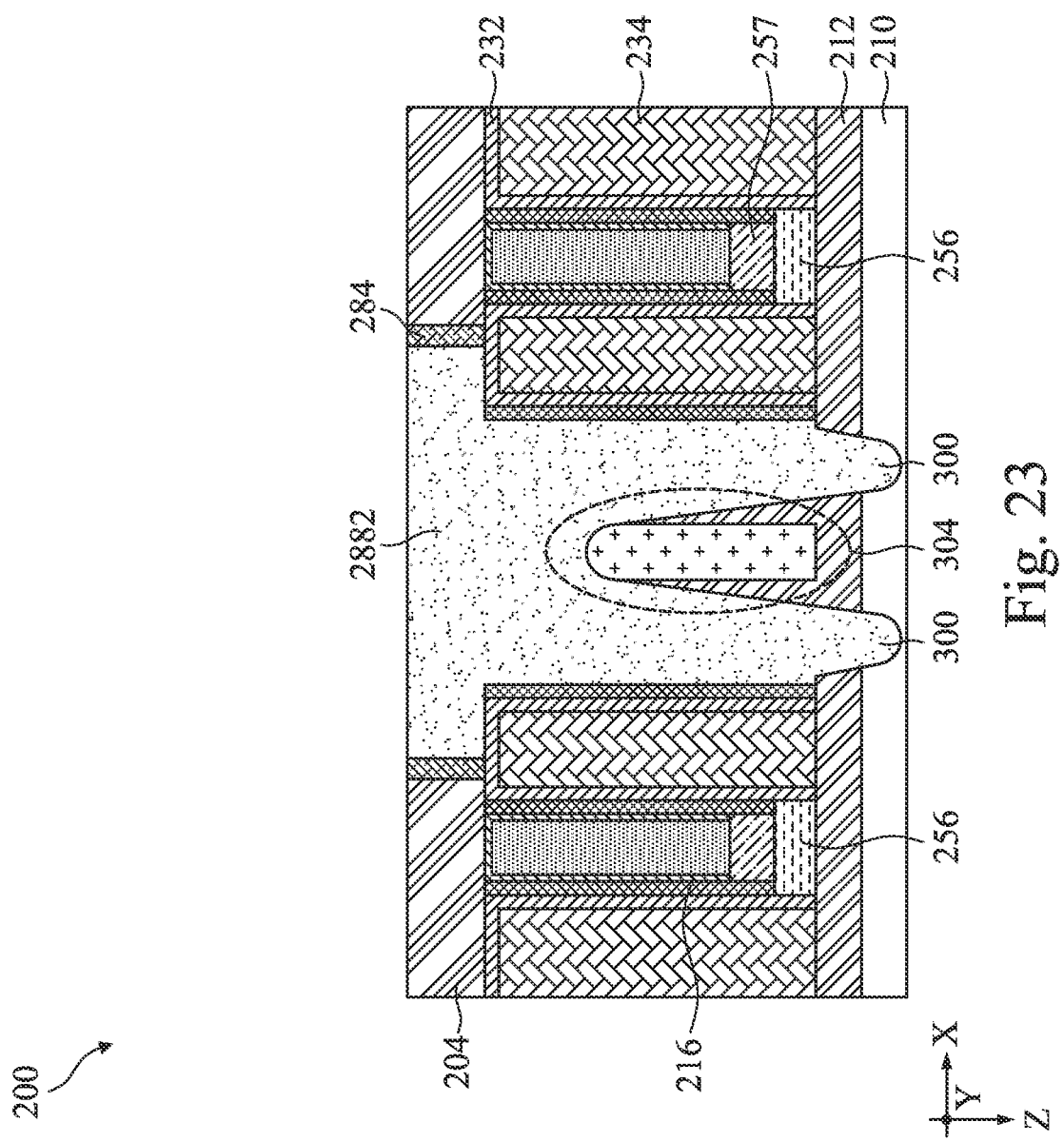

Gate cut features of the present disclosure may span across a slot source/drain contact. Referring to FIG. 21, a second slot pilot opening 2822 that spans across a first joint gate structure 2500, a second joint gate structure 2502, and a slot source/drain contact 302 may be formed at block 110 of the method 100. Referring then to FIG. 22, after formation of the liner 284, the second slot pilot opening 2822 is extended downward through the first joint gate structure 2500 and the second joint gate structure 2502 to form a second slot gate cut opening 2862. The second slot gate cut opening 2862 not only separates the first joint gate structure 2500 into two gate segments aligned along the Y direction but also separates the second joint gate structure 2502 into two gate segments aligned along the Y direction. In some implementations represented in FIG. 22, the etch process to form the second slot gate cut opening 2862 may etch the joint gate structures faster than it does the slot source/drain contact 302. As a result, a metal island 304 may be formed. FIG. 22 also illustrates that the second slot gate cut opening 2862 may include overshoot portions 2830 that extend through the ESL 212 and the top ILD layer 210 below the gate SAC dielectric layer 256. In these alternative embodiments, as shown in FIG. 23, operations at block 116 may form a second slot gate cut feature 2882 that generally tracks the shape of the second slot gate cut opening 2862. When viewed from the Y direction, the second slot gate cut feature 2882 includes leg portions 300 and straddles the metal island 304. The composition of the second slot gate cut feature 2882 may be similar to the gate cut feature 288 described above. The workpiece 200 in FIG. 23 is flipped up-side-down. When the workpiece 200 in FIG. 23 is flipped back to an upright position, the isolation feature 204 would be at the bottom and the two leg portions 300 would point upward.

Embodiments of the present disclosure provide advantages. For example, methods of the present disclosure form gate cut features from a backside of a workpiece. Using structures on the backside of the workpiece, the formation of the gate cut opening of the present disclosure is self-aligned and does not rely on high resolution or high overlay precision of the photolithography process.

In one exemplary aspect, the present disclosure is directed to a method. The method includes providing a workpiece including a frontside and a backside, the workpiece including a substrate, a first plurality of channel members over a first portion of the substrate, a second plurality of channel members over a second portion of the substrate, an isolation feature sandwiched between the first and second portions of the substrate, wherein the substrate is at the backside of the workpiece and the first and second pluralities of channel members are at the frontside of the workpiece. The method also includes forming a joint gate structure to wrap around each of the first and second pluralities of channel members, forming a pilot opening in the isolation feature, wherein the pilot opening exposes the joint gate structure from the backside of the workpiece, extending the pilot opening through the joint gate structure to form a gate cut opening that separates the joint gate structure into a first gate structure and a second gate structure, and depositing a dielectric material into the gate cut opening to form a gate cut feature. In some embodiments, the depositing of the dielectric material seals an air gap between the first and second gate structures. In some embodiments, the method further includes bonding the frontside of the workpiece to a carrier substrate and prior to the forming of the pilot opening, flipping the workpiece over. In some embodiments, the method further includes prior to the forming of the pilot opening, removing the first and second portions of the substrate from the backside of the workpiece to form a trench, where the trench exposes source/drain features abutting the first and second pluralities of channel members, and depositing a backside dielectric layer on the source/drain features. In some embodiments, the removing of the first and second portions of the substrate includes recessing the source/drain features. In some embodiments, the method further includes prior to the extending of the pilot opening, depositing a liner layer over sidewalls of the pilot opening. In some embodiments, the gate cut opening exposes a gate spacer deposited over sidewalls of the joint gate structure. In some embodiments, the method further includes prior to the depositing of the dielectric material, removing the gate spacer from the gate cut opening. In some embodiments, the method further includes prior to the forming of the pilot opening, forming a self-aligned contact (SAC) layer over the joint gate structure, where the extending of the pilot opening also extends the pilot opening through the SAC layer.

In another exemplary aspect, the present disclosure is directed to a method of forming a semiconductor device. The method includes forming a plurality of channel members over a base portion that protrudes from a substrate, the channel members being vertically stacked, depositing an isolation feature over sidewalls of the base portion, forming source/drain features over the base portion and abutting lateral ends of the channel members, forming a gate structure over the isolation feature and wrapping around each of the channel members, etching the base portion, thereby forming a first trench exposing the source/drain features and the gate structure from a backside of the semiconductor device, depositing a first dielectric layer in the first trench, etching the isolation feature, thereby forming a second trench exposing the first dielectric layer and the gate structure from the backside of the semiconductor device, depositing a second dielectric layer over sidewalls of the first dielectric layer, thereby reducing an opening size of the second trench, and etching the gate structure, thereby extending the second trench through the gate structure. In some embodiments, the method further includes after the extending of the second trench, depositing a dielectric material in the second trench. In some embodiments, the depositing of the dielectric material seals a void in the second trench. In some embodiments, the void is laterally stacked between portions of the second dielectric layer. In some embodiments, the forming of the first trench includes recessing the source/drain features. In some embodiments, the method further includes after the extending of the second trench, removing a gate spacer from sidewalls of the gate structure, thereby expanding an extended portion of the second trench.

In yet another exemplary aspect, the present disclosure is directed to a semiconductor device. The semiconductor device includes a first gate structure disposed over a first backside dielectric feature, a second gate structure disposed over a second backside dielectric feature, and a gate cut feature extending continuously from between the first gate structure and the second gate structure to between the first backside dielectric feature and the second backside dielectric feature, where the gate cut feature includes an air gap between the first gate structure and the second gate structure. In some embodiments, the semiconductor device further includes a liner disposed between the gate cut feature and the first backside dielectric feature and between the gate cut feature and the second backside dielectric feature. In some embodiments, the air gap extends continuously from between the first gate structure and the second gate structure to between the first backside dielectric feature and the second backside dielectric feature. In some embodiments, the semiconductor device further includes a gate spacer extending continuously from sidewalls of the first gate structure to sidewalls of the second gate structure. In some embodiments, the gate cut feature is in physical contact with the gate spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a workpiece including a frontside and a backside, the workpiece including a substrate, a first plurality of channel members over a first portion of the substrate, a second plurality of channel members over a second portion of the substrate, an isolation feature sandwiched between the first and second portions of the substrate, wherein the substrate is at the backside of the workpiece and the first and second pluralities of channel members are at the frontside of the workpiece;
   forming a joint gate structure to wrap around each of the first and second pluralities of channel members;
   forming a pilot opening in the isolation feature, wherein the pilot opening exposes the joint gate structure from the backside of the workpiece;
   extending the pilot opening through the joint gate structure to form a gate cut opening that separates the joint gate structure into a first gate structure and a second gate structure; and
   depositing a dielectric material into the gate cut opening to form a gate cut feature.

2. The method of claim 1, wherein the depositing of the dielectric material seals an air gap between the first and second gate structures.

3. The method of claim 1, further comprising:
   bonding the frontside of the workpiece to a carrier substrate; and
   prior to the forming of the pilot opening, flipping the workpiece over.

4. The method of claim 1, further comprising:
   prior to the forming of the pilot opening, removing the first and second portions of the substrate from the backside of the workpiece to form a trench, wherein the trench exposes source/drain features abutting the first and second pluralities of channel members; and depositing a backside dielectric layer on the source/drain features.

5. The method of claim 4, wherein the removing of the first and second portions of the substrate includes recessing the source/drain features.

6. The method of claim 1, further comprising:
prior to the extending of the pilot opening, depositing a liner layer over sidewalls of the pilot opening.

7. The method of claim 1, wherein the gate cut opening exposes a gate spacer deposited over sidewalls of the joint gate structure.

8. The method of claim 7, further comprising:
prior to the depositing of the dielectric material, removing the gate spacer from the gate cut opening.

9. The method of claim 1, further comprising:
prior to the forming of the pilot opening, forming a self-aligned contact (SAC) layer over the joint gate structure,
wherein the extending of the pilot opening also extends the pilot opening through the SAC layer.

10. A method of forming a semiconductor device, comprising:
forming a plurality of channel members over a base portion that protrudes from a substrate, the channel members being vertically stacked;
depositing an isolation feature over sidewalls of the base portion;
forming source/drain features over the base portion and abutting lateral ends of the channel members;
forming a gate structure over the isolation feature and wrapping around each of the channel members;
etching the base portion, thereby forming a first trench exposing the source/drain features and the gate structure from a backside of the semiconductor device;
depositing a first dielectric layer in the first trench;
etching the isolation feature, thereby forming a second trench exposing the first dielectric layer and the gate structure from the backside of the semiconductor device;
depositing a second dielectric layer over sidewalls of the first dielectric layer, thereby reducing an opening size of the second trench; and
etching the gate structure, thereby extending the second trench through the gate structure.

11. The method of claim 10, further comprising:
after the extending of the second trench, depositing a dielectric material in the second trench.

12. The method of claim 11, wherein the depositing of the dielectric material seals a void in the second trench.

13. The method of claim 12, wherein the void is laterally stacked between portions of the second dielectric layer.

14. The method of claim 10, wherein the forming of the first trench includes recessing the source/drain features.

15. The method of claim 10, further comprising:
after the extending of the second trench, removing a gate spacer from sidewalls of the gate structure, thereby expanding an extended portion of the second trench.

16. A method, comprising:
forming a first plurality of channel members over a first base portion protruding from a substrate and a second plurality of channel members over a second base portion protruding from the substrate;
depositing an isolation feature over sidewalls of the first and second base portions;
forming source/drain features over the first and second base portions;
forming a gate structure over the isolation feature and engaging the first and second pluralities of channel members;
etching the isolation feature, thereby forming a trench exposing a bottom surface of the gate structure;
depositing a dielectric liner over sidewalls of the trench;
etching the gate structure through the trench, thereby dividing the gate structure into a first gate structure segment engaging the first plurality of channel members and a second gate structure segment engaging the second plurality of channel members; and
depositing an isolation material into the trench, wherein the isolation material isolates the first gate structure segment from the second gate structure segment.

17. The method of claim 16, further comprising:
etching the first and second base portions to expose a bottom surface of the source/drain features; and
depositing a dielectric layer in physical contact with the bottom surface of the source/drain features.

18. The method of claim 17, wherein the dielectric liner is in physical contact with the dielectric layer.

19. The method of claim 16, further comprising:
depositing a gate spacer layer on sidewalls of the gate structure, wherein after the etching of the gate structure the gate spacer layer is exposed in the trench.

20. The method of claim 19, further comprising:
after the gate spacer layer is exposed in the trench, removing the gate spacer layer to expand the trench.

* * * * *